(12) United States Patent
Senoo et al.

(10) Patent No.: US 9,853,024 B2
(45) Date of Patent: Dec. 26, 2017

(54) SEMICONDUCTOR DEVICE

(71) Applicant: TOYOTA JIDOSHA KABUSHIKI KAISHA, Toyota-shi, Aichi-ken (JP)

(72) Inventors: Masaru Senoo, Okazaki (JP); Yasuhiro Hirabayashi, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/124,219

(22) PCT Filed: Sep. 4, 2015

(86) PCT No.: PCT/JP2015/075262
§ 371 (c)(1),
(2) Date: Sep. 7, 2016

(87) PCT Pub. No.: WO2016/072144
PCT Pub. Date: May 12, 2016

(65) Prior Publication Data
US 2017/0250179 A1    Aug. 31, 2017

(30) Foreign Application Priority Data

Nov. 4, 2014    (JP) .................................. 2014-224247

(51) Int. Cl.
*H01L 29/739*    (2006.01)
*H01L 27/06*    (2006.01)
(Continued)

(52) U.S. Cl.
CPC ...... *H01L 27/0664* (2013.01); *H01L 29/0696* (2013.01); *H01L 29/1095* (2013.01);
(Continued)

(58) Field of Classification Search
CPC ........................ H01L 27/0664; H01L 29/7397
See application file for complete search history.

(56) References Cited

U.S. PATENT DOCUMENTS 9,276,137 B2 *    3/2016    Yamashita ............ H01L 29/872
9,666,704 B2 *    5/2017    Hosokawa
(Continued)

FOREIGN PATENT DOCUMENTS

| JP | 2008-021930 A | 1/2008 |
| JP | 2013-048230 A | 3/2013 |
| WO | WO 2013/014943 | * 1/2013 |

*Primary Examiner* — Benjamin Sandvik
(74) *Attorney, Agent, or Firm* — Oliff PLC

(57) ABSTRACT

A semiconductor device having a low on-voltage of IGBT and a small reverse recovery current of the diode is provided. The semiconductor device includes a semiconductor substrate having a gate trench and a dummy trench. The semiconductor substrate includes emitter, body, barrier and pillar regions between the gate trench and the dummy trench. The emitter region is an n-type region being in contact with the gate insulating film and exposed on a front surface. The body region is a p-type region being in contact with the gate insulating film at a rear surface side of the emitter region. The barrier region is an n-type region being in contact with the gate insulating film at a rear surface side of the body region and in contact with the dummy insulating film. The pillar region is an n-type region connected to the front surface electrode and the barrier region.

6 Claims, 21 Drawing Sheets

(51) Int. Cl.
*H01L 29/872* (2006.01)
*H01L 29/10* (2006.01)
*H01L 29/06* (2006.01)
*H01L 29/40* (2006.01)

(52) U.S. Cl.
CPC ........ *H01L 29/407* (2013.01); *H01L 29/7397* (2013.01); *H01L 29/872* (2013.01)

(56) References Cited

U.S. PATENT DOCUMENTS

| | | |
|---|---|---|
| 9,691,888 B1* | 6/2017 | Okawara ............. H01L 29/7397 |
| 2008/0012050 A1 | 1/2008 | Aoki et al. |
| 2014/0048847 A1 | 2/2014 | Yamashita et al. |
| 2016/0071841 A1* | 3/2016 | Saito ................... H01L 27/0716 |
| | | 257/140 |

* cited by examiner

SEMICONDUCTOR DEVICE

TECHNICAL FIELD

Cross-Reference to Related Applications

The present application is a related application of Japanese Patent Application No. 2014-224247 filed on Nov. 4, 2014, and claims priority based on this Japanese Patent Application. The entire contents described in this Japanese Patent Application are hereby incorporated as components of the present specification.

The present specification discloses an art related to a semiconductor device that has both of a function of an IGBT and a function of a diode (an RC-IGBT (Reverse Conducting-Insulated Gate Bipolar Transistor)).

BACKGROUND ART

Japanese Patent Application Publication No. 2013-48230 A (hereinafter referred to as Patent Literature 1) discloses an RC-IGBT. This RC-IGBT includes an IGBT structure configured with an n-type emitter region, a p-type body region, an n-type drift region, an n-type collector region, a trench gate electrode, and the like, and the p-type body region also serves as an anode region to provide a diode structure as well. In this RC-IGBT, an n-type barrier region is formed under the body region, which also serves as the anode region, and an n-type pillar region that connects the barrier region and a front surface electrode (which serves both as an emitter electrode and as an anode electrode) is formed. The pillar region is formed in a spacing between adjacent gate trenches. In this RC-IGBT, a potential of the barrier region is maintained at a potential closer to a potential of the front surface electrode, and hence this makes it difficult for a diode configured with a pn junction between the body region and the barrier region to be turned on. This diode is turned on when the potential of the front surface electrode is further raised. The RC-IGBT in Patent Literature 1 utilizes the barrier region and the pillar region to suppress a flow of holes from the p-type body region into the n-type barrier region and the n-type drift region, and suppress a reverse recovery current of the diode.

Japanese Patent Application Publication No. 2008-21930 A (hereinafter referred to as Patent Literature 2) discloses a semiconductor device to which a dummy trench is added, in addition to a gate trench. In this semiconductor device, a pair of the dummy trenches is provided in a spacing between the adjacent gate trenches. A dummy electrode in each of the dummy trenches is insulated from a gate electrode in the gate trench, and connected to a source potential. In this semiconductor device, a pn diode configured with a p-type body region and an n-type drain region is formed in a spacing between the gate trench and the dummy trench. Moreover, there is formed, between the pair of the dummy trenches, an n-type region that is connected to the drift layer and Schottky-connected to a front surface electrode (which serves both as a source electrode and as an anode electrode). In this semiconductor device, the n-type region allows the drift region and the front surface electrode to be in Schottky-contact with each other, and hence a reverse recovery current of the pn diode is suppressed.

SUMMARY OF INVENTION

Technical Problem

In the case of Patent Literature 1, the pillar region needs to be formed in the spacing between the adjacent gate trenches. If the pillar region is located at a position close to the gate trench, characteristics of the diode easily change due to a voltage applied to the gate electrode, making it difficult to stably operate the diode. Accordingly, a prescribed spacing needs to be provided between the pillar region and the gate trench. If the pillar region is located in the spacing between the adjacent gate trenches as in Patent Literature 1, the spacing between the adjacent gate trenches needs to be increased. If the spacing between the adjacent gate trenches is increased, characteristics of the IGBT deteriorate. In a trench gate-type IGBT, a current flows bypassing the trenches while the IGBT is on, and hence a hole density increases in the spacing between the adjacent trenches. The increase in hole density in the spacing between the trenches enables electrons to flow in that region with a low loss, causing a decrease in on-voltage of the IGBT. The effect of carriers being accumulated in the spacing between the trenches to thereby decrease an on-voltage of the IGBT is hereinafter called a carrier accumulation effect. The narrower the spacing between the trenches becomes, the more significantly the carrier accumulation effect is exhibited.

In the semiconductor device in Patent Literature 2, the n-type region, which is in Schottky-contact with the front surface electrode, is formed at a position separated from the pn diode by the dummy trench. In other words, the n-type region, which is in Schottky-contact, is formed at a position apart from the pn diode. Accordingly, while the pn diode is on, a flow of holes from the p-type region into the n-type region (the drift region) in the pn diode cannot sufficiently be suppressed. Consequently, there occurs a problem of a large reverse recovery current of the diode.

Solution to Technical Problem

The present teachings disclose an art capable of stably operating the diode, even if the spacing between the adjacent trenches is narrowed. In other words, the present teachings disclose an art to improve characteristics of the IGBT, while realizing a stable operation of the diode.

A semiconductor device disclosed herein comprises: a semiconductor substrate including a gate trench and a dummy trench which are provided in a front surface of the semiconductor substrate; a front surface electrode located on the front surface of the semiconductor substrate; and a rear surface electrode located on a rear surface of the semiconductor substrate. A gate insulating film and a gate electrode insulated from the semiconductor substrate by the gate insulating film are located in the gate trench. A dummy insulating film and a dummy electrode insulated from the semiconductor substrate by the dummy insulating film and electrically separated from the gate electrode are located in the dummy trench. The semiconductor substrate comprises: an emitter region of n-type, a body region of p-type, a barrier region of n-type, a pillar region of n-type, a drift region of n-type, a collector region of p-type, and a cathode region of n-type. The emitter region is located between the gate trench and the dummy trench, in contact with the gate insulating film, and exposed on the front surface of the semiconductor substrate. The body region is located between the gate trench and the dummy trench and in contact with the gate insulating film at a rear surface side of the emitter region. The barrier region located between the gate trench and the dummy trench and in contact with the gate insulating film and the dummy insulating film at a rear surface side of the body region. The pillar region is located between the gate trench and the dummy trench, connected to the front surface electrode, and connected to the barrier region. The drift region is located on a rear surface side with respect to the barrier region, separated from the body region by the barrier region. The drift region has a density of n-type impurities lower than a density of n-type impurities in the barrier region. The collector region is exposed on the rear surface of the semiconductor substrate. The cathode region is exposed on the rear surface of the semiconductor substrate and has a density of n-type impurities higher than the density of n-type impurities in the drift region.

In the above-described semiconductor device, an IGBT is formed with the emitter region, the body region, the barrier region, the drift region, the collector region, the gate trench, and the like. Moreover, a pn diode is formed with the body region, the barrier region, the drift region, the cathode region, and the like.

In this semiconductor device, a pn junction that configures the pn diode (i.e., a boundary between the body region and the barrier region) is formed between the gate trench and the dummy trench. Moreover, the pillar region that connects the barrier region and the front surface electrode is formed between the gate trench and the dummy trench. In contrast to the case in Patent Literature 2, the pn junction and the pillar region are formed in one range delimited by the two trenches. In other words, the pillar region is formed adjacent to the pn junction. Consequently, as in the case of Patent Literature 1, a flow of holes from the p-type region (the body region) into the n-type region (the barrier region and the drift region) in the pn diode can effectively be suppressed. Consequently, in this semiconductor device, the reverse recovery current of the diode is small. Moreover, in this semiconductor device, among the two trenches that delimit the range where the pn junction and the pillar region are formed, one of them is a gate trench and the other of them is a dummy trench. The dummy electrode in the dummy trench is electrically separated from the gate electrode, and hence the potential of the dummy electrode is stable. Accordingly, the pillar region can be located close to the dummy trench, and can even be brought into contact with the dummy trench. In other words, there is no need to provide a wide spacing between the pillar region and the dummy trench. According to this semiconductor device, the spacing between the gate trench and the dummy trench can be made narrower than the spacing between the adjacent trenches described in Patent Literature 1, while suppressing an influence of a gate potential on the pillar region. By narrowing the spacing between the trenches, the carrier accumulation effect can sufficiently be obtained during an operation of the IGBT. Consequently, the on-voltage of the IGBT in this semiconductor device is low.

DESCRIPTION OF EMBODIMENTS

Embodiment 1

Figure 1:
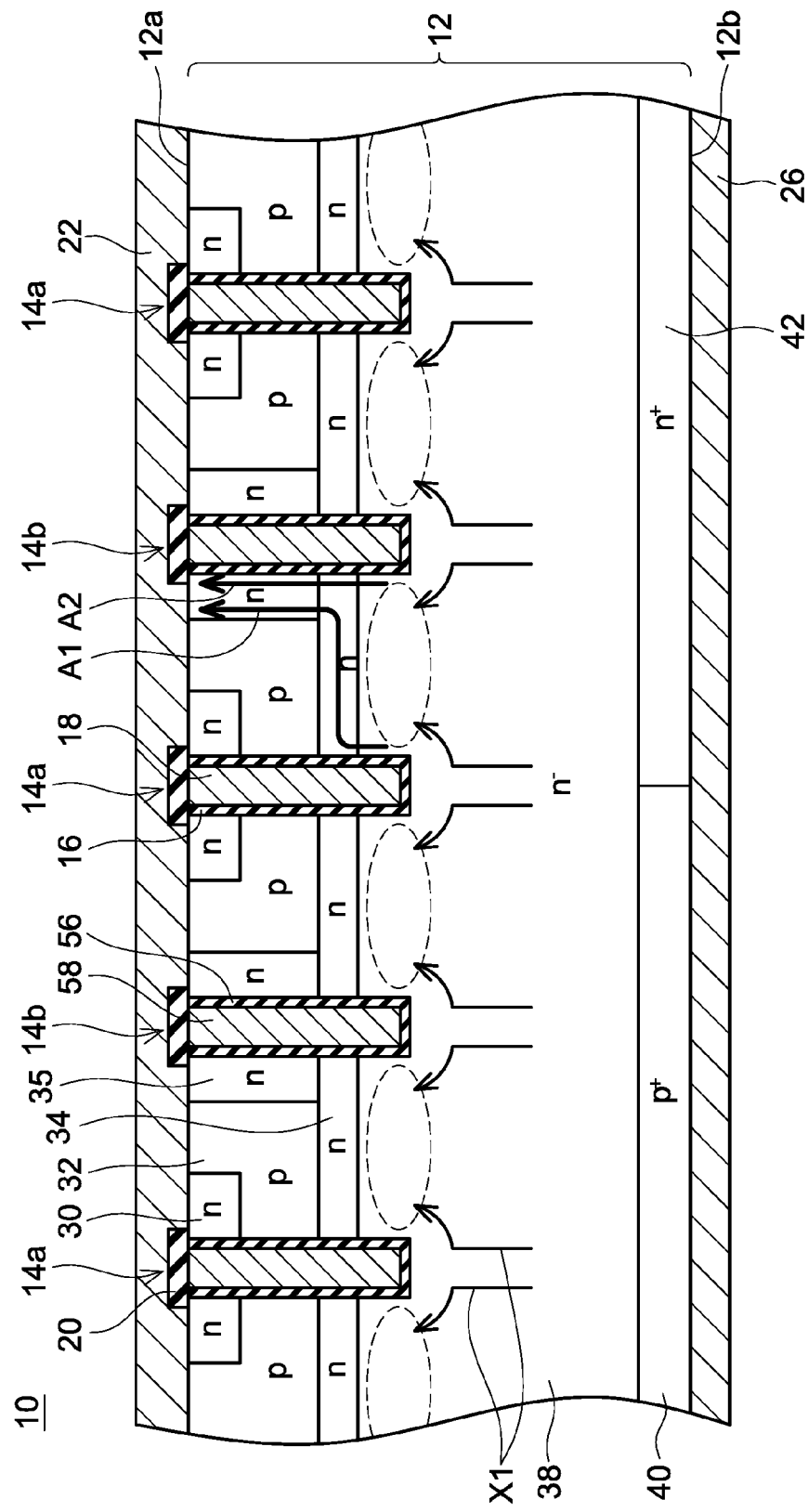
FIG. 1 shows a vertical cross-sectional view of a semiconductor device 10 in Embodiment 1.

A semiconductor device 10 in Embodiment 1 shown in FIG. 1 is an RC-IGBT that includes an IGBT and a diode. The semiconductor device 10 has a semiconductor substrate 12 constituted of Si.

An upper electrode 22 is formed on an upper surface 12*a* of the semiconductor substrate 12. The upper electrode 22 is constituted of Al or AlSi. Alternatively, the upper electrode 22 may be a laminated electrode in which Al (or AlSi), Ti, Ni, and Au are stacked on the upper surface 12*a*. The upper electrode 22 has a thickness of approximately 5 to 30 μm.

A lower electrode 26 is formed on a lower surface 12*b* of the semiconductor substrate 12. The lower electrode 26 is a laminated electrode in which Al (or AlSi), Ti, Ni, and Au are stacked on the lower surface 12*b*. Alternatively, the lower electrode 26 may be a laminated electrode in which Ti, Ni, and Au are stacked on the lower surface 12*b*. The lower electrode 26 has a thickness of approximately 1 to 30 μm.

Figure 2:
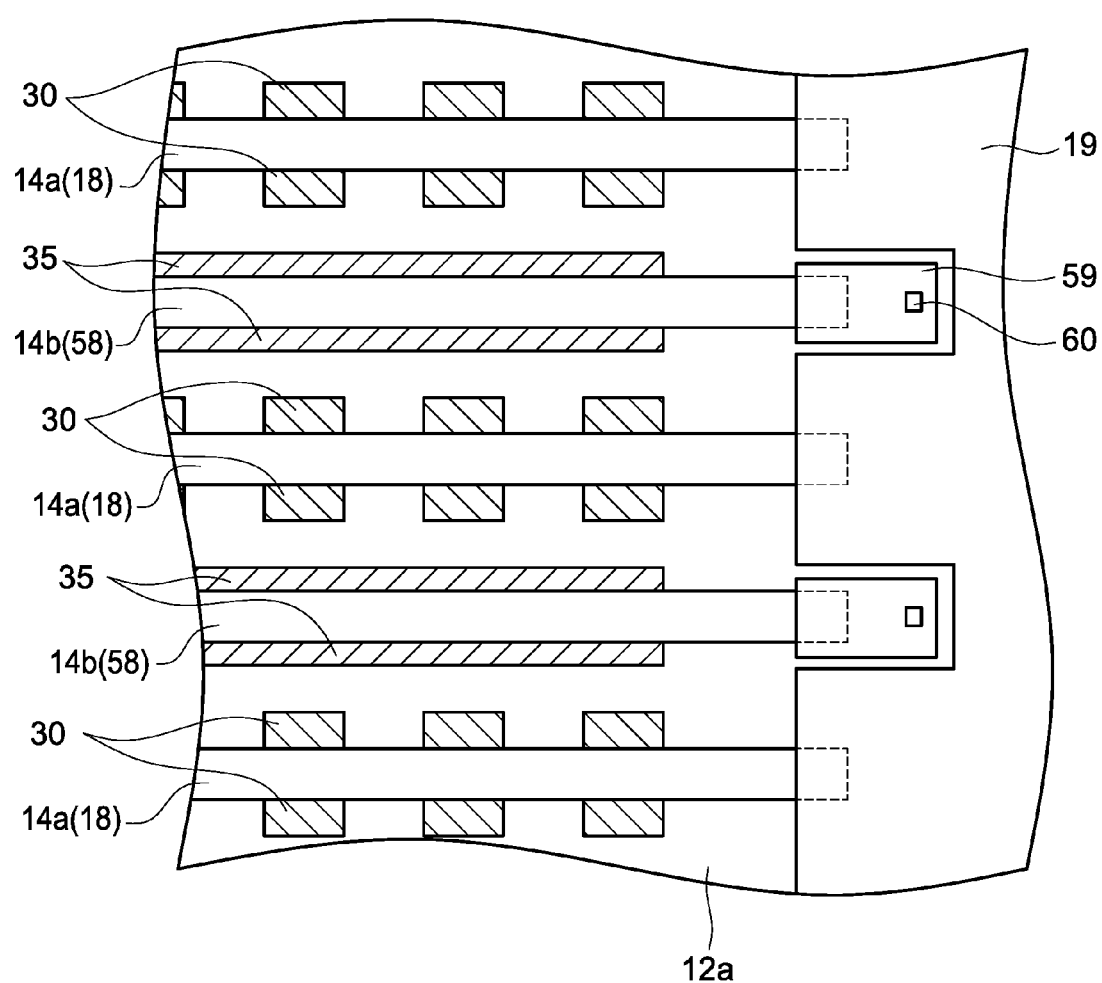
FIG. 2 shows a top view of the semiconductor device 10 in Embodiment 1 (Notably, only the elements necessary for description are shown)

A plurality of trenches 14 (14*a*, 14*b*) are formed in the upper surface 12*a* of the semiconductor substrate 12. The trenches 14 have approximately equal depths. Each of the trenches 14 can be set to have a depth of approximately 4 to 6 μm. Among the plurality of trenches 14, the trenches 14a are gate trenches, in each of which a gate electrode 18 is located. Among the plurality of trenches 14, the trenches 14b are dummy trenches, in each of which a dummy electrode 58 is located. As shown in FIG. 2, the gate trenches 14a and the dummy trenches 14b are formed in parallel to each other in the upper surface 12a. The gate trenches 14a and the dummy trenches 14b are alternately arranged in the upper surface 12a.

As shown in FIG. 1, an inner surface of each of the gate trenches 14a is covered with a corresponding gate insulating film 16. The gate electrode 18 is located in each of the gate trenches 14a. Each gate electrode 18 is insulated from the semiconductor substrate 12 by the gate insulating film 16. An upper surface of each gate electrode 18 is covered with a corresponding interlayer insulating film 20. Each gate electrode 18 is insulated from the upper electrode 22 by the corresponding interlayer insulating film 20. As shown in FIG. 2, an end portion of the gate electrode 18 in a longitudinal direction extends to an underside of a gate wiring 19. The gate electrode 18 is electrically connected to the gate wiring 19 via a contact portion not shown.

As shown in FIG. 1, an inner surface of each of the dummy trenches 14b is covered with a corresponding dummy insulating film 56. The dummy electrode 58 is located in each of the dummy trenches 14b. In the dummy trench 14b, the dummy electrode 58 is insulated from the semiconductor substrate 12 by the corresponding dummy insulating film 56. An upper surface of each dummy electrode 58 is covered with a corresponding interlayer insulating film 20. Above the dummy trench 14b, each dummy electrode 58 is insulated from the upper electrode 22 by the corresponding interlayer insulating film 20. It is noted that, as shown in FIG. 2, a polysilicon wiring 59 and a contact portion 60 are formed on an end portion of the dummy electrode 58 in a longitudinal direction. The dummy electrode 58 is electrically connected to the upper electrode 22 via the polysilicon wiring 59 and the contact portion 60. The dummy electrode 58 is not connected to the gate electrode 18. In other words, the dummy electrode 58 is not in conduction with the gate electrode 18 at any position, and electrically separated from the gate electrode 18.

Emitter regions 30, a body region 32, a barrier region 34, pillar regions 35, a drift region 38, a collector region 40, and a cathode region 42 are formed in the semiconductor substrate 12. Each of the emitter regions 30, the body region 32, the barrier region 34, and each of the pillar regions 35 are formed in a semiconductor region between the corresponding gate trench 14a and the corresponding dummy trench 14b (which is hereinafter referred to as a cell region).

The emitter region 30 is an n-type semiconductor region that contains arsenic or phosphorus as impurities. The emitter region 30 is exposed on the upper surface 12a of the semiconductor substrate 12. The emitter region 30 is in ohmic contact with the upper electrode 22. The emitter region 30 is in contact with the gate insulating film 16. The emitter region 30 has a density of n-type impurities of approximately $1\times10^{18}$ to $1\times10^{21}$/cm$^3$. The emitter region 30 has a thickness of approximately 0.2 to 1.5 μm.

The body region 32 is a p-type semiconductor region that contains boron as impurities. The body region 32 is formed lateral to and under the emitter region 30, and in contact with the emitter region 30. The body region 32 is exposed on the upper surface 12a of the semiconductor substrate 12 at a position lateral to the emitter region 30. A density of p-type impurities in the body region 32 is high in the proximity of the upper electrode 22, and low in other regions. The body region 32 is in ohmic contact with the upper electrode 22. The body region 32 is in contact with the gate insulating film 16 under the emitter region 30. The body region 32 has a density of p-type impurities of approximately $1\times10^{16}$ to $1\times10^{19}$/cm$^3$. The body region 32 has a thickness of approximately 0.2 to 5.0 μm.

The barrier region 34 is an n-type semiconductor region that contains phosphorus as impurities. The barrier region 34 is formed under the body region 32, and in contact with the body region 32. The barrier region 34 is in contact with the gate insulating film 16 under the body region 32. The barrier region 34 extends from a position where the barrier region 34 itself is in contact with the gate insulating film 16, to the dummy trench 14b, and is in contact with the dummy insulating film 56. The barrier region 34 is separated from the emitter region 30 by the body region 32. The barrier region 34 has a density of n-type impurities of approximately $1\times10^{15}$ to $1\times10^{18}$/cm$^3$. The barrier region 34 has a thickness of approximately 0.2 to 3.0 μm.

The pillar region 35 is an n-type semiconductor region that contains phosphorus as impurities. The pillar region 35 is formed lateral to the body region 32, and in contact with the body region 32. Moreover, the pillar region 35 is formed at a position adjacent to the dummy trench 14b. The pillar region 35 extends from the upper surface 12a of the semiconductor substrate 12 to the barrier region 34 along a downward direction (a thickness direction of the semiconductor substrate 12). The pillar region 35 is in contact with the dummy insulating film 56, in approximately the entirety of its depth range. The pillar region 35 is formed at a position that is in contact with the dummy insulating film 56 as such, to thereby make a spacing between the dummy trench 14b and the gate trench 14a narrow (i.e., narrower than the spacing between the gate trenches in the RC-IGBT in Patent Literature 1). An upper end portion of the pillar region 35 is exposed on the upper surface 12a of the semiconductor substrate 12. The pillar region 35 is in Schottky-contact with the upper electrode 22. A lower end of the pillar region 35 is connected to the barrier region 34. In other words, the pillar region 35 is consecutive to the barrier region 34. The pillar region 35 has a density of n-type impurities of approximately $8\times10^{13}$ to $1\times10^{18}$/cm$^3$.

The drift region 38 is an n-type semiconductor region that contains phosphorus as impurities. The drift region 38 has a density of n-type impurities lower than a density of n-type impurities in the barrier region 34. The drift region 38 extends astride the regions under a plurality of the cell regions. The drift region 38 is in contact with the barrier region 34. The drift region 38 is in contact with the gate insulating film 16 under the barrier region 34. The drift region 38 is in contact with the dummy insulating film 56 under the barrier region 34. The drift region 38 is separated from the body region 32 by the barrier region 34. The drift region 38 has a thickness of 80 to 165 μm, and the drift region 38 has a resistivity of approximately 40 to 100 Ωcm.

The collector region 40 is a p-type semiconductor region that contains boron as impurities. The collector region 40 is formed under the drift region 38, and in contact with the drift region 38. The collector region 40 is exposed on the lower surface 12b of the semiconductor substrate 12. The collector region 40 is in ohmic contact with the lower electrode 26. The collector region 40 has a density of p-type impurities of approximately $1\times10^{15}$ to $1\times10^{19}$ cm$^3$. The collector region 40 has a thickness of approximately 0.2 to 3.0 μm.

The cathode region 42 is an n-type semiconductor region that contains phosphorus as impurities. The cathode region 42 has a density of n-type impurities higher than a density of n-type impurities in each of the drift region 38, the barrier region 34, and the pillar region 35. The cathode region 42 is formed under the drift region 38, and in contact with the drift region 38. The cathode region 42 is exposed on the lower surface 12b of the semiconductor substrate 12 at a position adjacent to the collector region 40. The cathode region 42 is in ohmic contact with the lower electrode 26. The cathode region 42 has a density of n-type impurities of approximately $1 \times 10^{18}$ to $1 \times 10^{21}$ cm$^3$. The cathode region 42 has a thickness of approximately 0.2 to 3.0 µm.

In the semiconductor substrate 12, an IGBT connected between the upper electrode 22 and the lower electrode 26 is formed with the emitter region 30, the body region 32, the barrier region 34, the drift region 38, the collector region 40, the gate electrode 18, and the gate insulating film 16. When the IGBT is operated, the upper electrode 22 functions as an emitter electrode of the IGBT, and the lower electrode 26 functions as a collector electrode of the IGBT. Moreover, in the semiconductor substrate 12, a pn diode connected between the upper electrode 22 and the lower electrode 26 is formed with the body region 32, the barrier region 34, the drift region 38, and the cathode region 42. When the pn diode is operated, the upper electrode 22 functions as an anode electrode of the pn diode, and the lower electrode 26 functions as a cathode electrode of the pn diode. In the semiconductor substrate 12, a Schottky barrier diode (hereinafter referred to as an SBD) connected between the upper electrode 22 and the lower electrode 26 is formed with the pillar region 35, the barrier region 34, the drift region 38, and the cathode region 42. When the SBD is operated, the upper electrode 22 functions as an anode of the SBD, and the lower electrode 26 functions as a cathode of the SBD.

An operation of the IGBT will be described. When the IGBT is to be turned on, a potential higher than a potential of the upper electrode 22 is applied to the lower electrode 26. When a potential equal to or higher than a threshold value is applied to the gate electrode 18, a channel is formed in the body region 32 in the proximity of the gate insulating film 16. As a result, electrons flow from the upper electrode 22 toward the lower electrode 26 through the emitter region 30, the channel in the body region 32, the barrier region 34, the drift region 38, and the collector region 40. Moreover, holes flow from the lower electrode 26 toward the upper electrode 22 through the collector region 40, the drift region 38, the barrier region 34, and the body region 32. As indicated by an arrow X1 in FIG. 1, the holes that flow in the drift region 38 flow bypassing the gate trench 14a and the dummy trench 14b. Accordingly, the holes are collected in a region in the drift region 38, between the gate trench 14a and the dummy trench 14b (i.e., a region indicated by dashed lines in FIG. 1). Here, if the spacing between the gate trench 14a and the dummy trench 14b were wide, the density of holes would be high exclusively in a region in the proximity of the gate trench 14a and the dummy trench 14b, in the region indicated by dashed lines. In the semiconductor device 10, however, the spacing between the gate trench 14a and the dummy trench 14b is narrow, and hence the density of holes becomes high in the entire region indicated by dashed lines. Accordingly, an electrical resistance in the drift region 38 within the region indicated by dashed lines becomes extremely low, enabling electrons to pass through the drift region 38 with a low loss. As such, in the IGBT in the semiconductor device 10, the carrier accumulation effect can sufficiently be obtained. Consequently, the on-voltage of this IGBT is low. Moreover, in this semiconductor device 10, the gate trenches 14a and the dummy trenches 14b are alternately arranged, and the emitter region 30 and the body region 32 are formed in each of the cell regions located between the gate trenches 14a and the dummy trenches 14b, respectively. Accordingly, the IGBT operates in each of the cell regions, and carriers are accumulated approximately uniformly in portions of the drift region 38 below the cell regions (i.e., portions indicated by dashed lines), respectively. Carriers are prevented from being accumulated exclusively below a particular cell region, and current concentration in the particular cell region is suppressed. An improvement in switching resistance can thereby be realized.

Afterwards, when the potential of the gate electrode 18 is lowered to a potential less than the threshold value, the channel disappears and a current stops. In other words, the IGBT is turned off.

Next, an operation of each of the pn diode and the SBD will be described. When the pn diode and the SBD are to be turned on, a voltage that makes the potential of the upper electrode 22 higher (i.e., a forward voltage) is applied between the upper electrode 22 and the lower electrode 26. Hereinafter is considered the case where the potential of the upper electrode 22 is gradually raised from a potential equivalent to the potential of the lower electrode 26. When the potential of the upper electrode 22 is raised, Schottky-contact portions at an interface between the pillar region 35 and the upper electrode 22 are brought into conduction. In other words, the SBD is turned on. As a result, electrons flow from the lower electrode 26 toward the upper electrode 22 through the drift region 38, the barrier region 34, and the pillar region 35. As such, when the SBD is turned on, the potential of the barrier region 34 becomes a potential close to the potential of the upper electrode 22. Accordingly, a potential difference is less easily generated at a pn junction on a boundary between the body region 32 and the barrier region 34. Accordingly, even if the potential of the upper electrode 22 is subsequently raised, the pn diode is not turned on for a while. When the potential of the upper electrode 22 is further raised, a current that flows in the SBD is increased. The more current flows in the SBD, the larger potential difference is generated between the upper electrode 22 and the barrier region 34, and the larger potential difference is also generated at the pn junction on the boundary between the body region 32 and the barrier region 34. Consequently, when the potential of the upper electrode 22 is raised to a potential equal to or higher than a prescribed potential, the pn diode is turned on. In other words, holes flow from the upper electrode 22 toward the lower electrode 26 through the body region 32, the barrier region 34, the drift region 38, and the cathode region 42. Moreover, electrons flow from the lower electrode 26 toward the upper electrode 22 through the cathode region 42, the drift region 38, the barrier region 34, and the body region 32. As such, in the semiconductor device 10, when the potential of the upper electrode 22 is raised, the SBD is initially turned on, thereby causing a delay in the timing at which the pn diode is turned on. A flow of holes from the body region 32 into the drift region 38 is thereby suppressed.

When a reverse voltage (a voltage that makes the potential of the upper electrode 22 lower) is applied between the upper electrode 22 and the lower electrode 26 after the pn diode is turned on, the pn diode performs a reverse recovery operation, which will be described below. While the pn diode is on, holes exist in the drift region 38. If a reverse voltage is applied, the holes in the drift region 38 pass through the body region 32 and are discharged into the upper electrode 22. This flow of holes causes generation of a reverse current instantaneously in the pn diode. However, in the semiconductor device 10, when the pn diode is turned on, the SBD suppresses a flow of holes from the body region 32 into the drift region 38 as described above. Accordingly, when the pn diode performs a reverse recovery operation, the holes that exist in the drift region 38 are small in number. Accordingly, a reverse recovery current of the pn diode is also small. As such, in the semiconductor device 10, a reverse recovery current of the pn diode is suppressed.

Notably, when the SBD operates, there may be a case where the potential of the gate electrode 18 varies. The characteristics of the SBD generally vary in accordance with the potential of the gate electrode 18. In the semiconductor device 10, however, the variations in characteristics of the SBD under the influence of the potential of the gate electrode 18 is minimized. The details thereof will hereinafter be described.

If the potential of the gate electrode 18 is high, a channel is formed in the body region 32. If a channel is formed in the body region 32 during an operation of the SBD, the potential of the barrier region 34 in the proximity of the gate insulating film 16 becomes a potential close to the potential of the upper electrode 22, and a potential difference is less easily generated between the Schottky-contact portions in the SBD (i.e., the contact portions of the pillar region 35 and the upper electrode 22). If the potential of the gate electrode 18 is low and no channel is formed, such a phenomenon does not occur. Therefore, a forward voltage necessary for the SBD to be turned on varies depending on the potential of the gate electrode 18. A phenomenon in which the characteristics of the diode vary depending on the potential of the gate electrode 18 in the RC-IGBT, as such, is called a gate interference. If the pillar region 35 were formed in the proximity of the gate trench 14a, a lower end portion of the pillar region 35 would be located near a lower end portion of the channel, and hence the SBD would be directly influenced by the gate interference. In contrast to this, in the semiconductor device 10 in Embodiment 1, the pillar region 35 is formed at a position farthest from the gate trench 14a in the cell region. Accordingly, even if the potential of the barrier region 34 in the proximity of the gate insulating film 16 varies, the potential of the lower end portion of the pillar region 35 does not vary so much. Accordingly, the characteristics of the SBD less easily vary. As such, in this semiconductor device 10, the gate interference less easily causes changes in characteristics of the SBD. Notably, no channel is formed on the periphery of the dummy trench 14b, and hence even if the pillar region 35 is located close to the dummy trench 14b, a problem of the gate interference does not occur.

Moreover, the potential of the gate electrode 18 also influences a resistance value of the pillar region 35. In other words, when the potential of the gate electrode 18 changes, an electric field generated from the gate electrode 18 changes, causing changes in distribution of carriers in the pillar region 35. Accordingly, a resistance of the pillar region 35 changes depending on the potential of the gate electrode 18. If the pillar region 35 were formed in the proximity of the gate trench 14a, the pillar region 35 would easily be influenced by the electric field generated from the gate electrode 18. However, in the semiconductor device 10, the pillar region 35 is formed at a position farthest from the gate trench 14a in the cell region. Consequently, in the semiconductor device 10 in the embodiment, the pillar region 35 is less easily influenced by the electric field generated from the gate electrode 18. Accordingly, even if the potential of the gate electrode 18 changes, a resistance of the pillar region 35 seldom changes. Notably, the potential of the dummy electrode 58 is fixed to the potential of the upper electrode 22, and hence even if the pillar region 35 is located close to the dummy trench 14b, there occurs no problem of variations in resistance of the pillar region 35.

As described above, in this semiconductor device 10, variations in characteristics of the SBD under the influence of the variations in potential of the gate electrode 18 are minimized.

Figure 3:
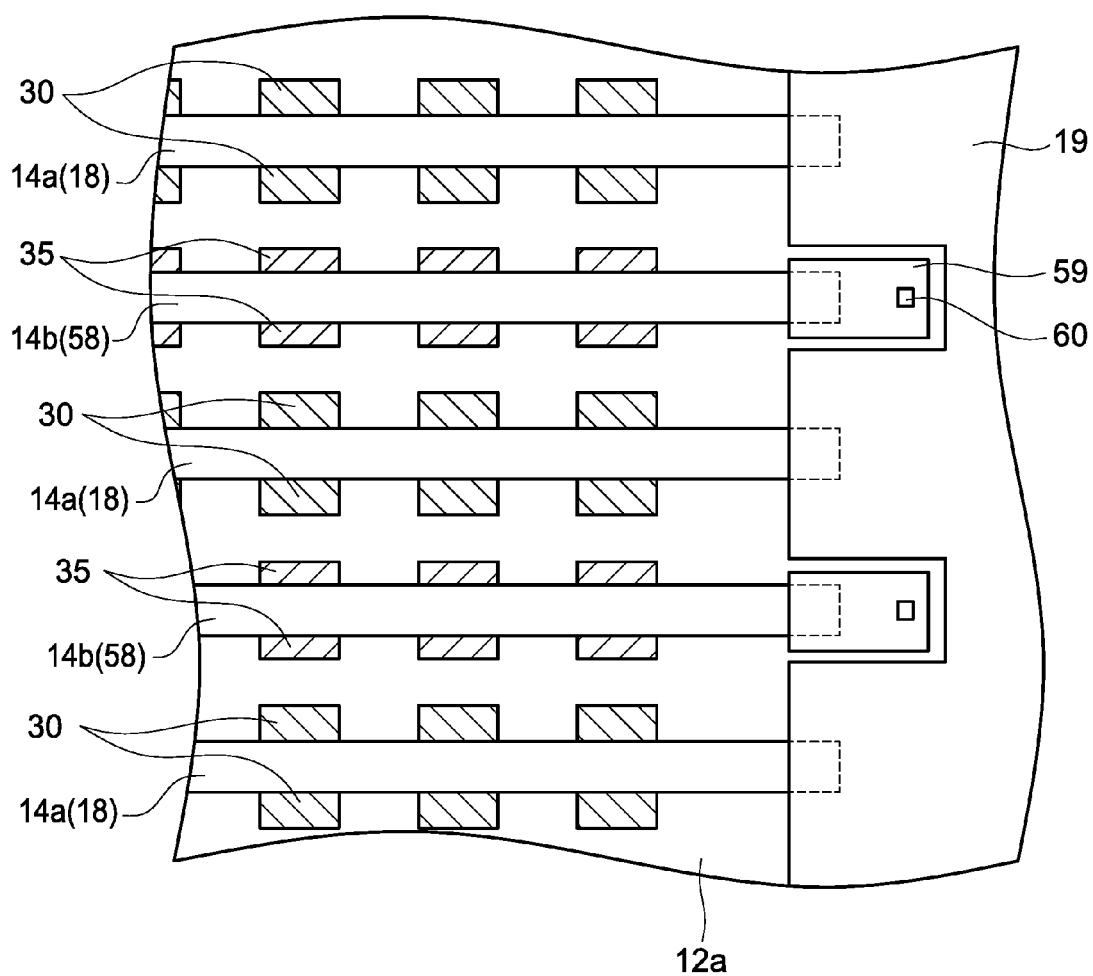
FIG. 3 shows a top view of a semiconductor device in a variation (Notably, only the elements necessary for description are shown)
Figure 4:
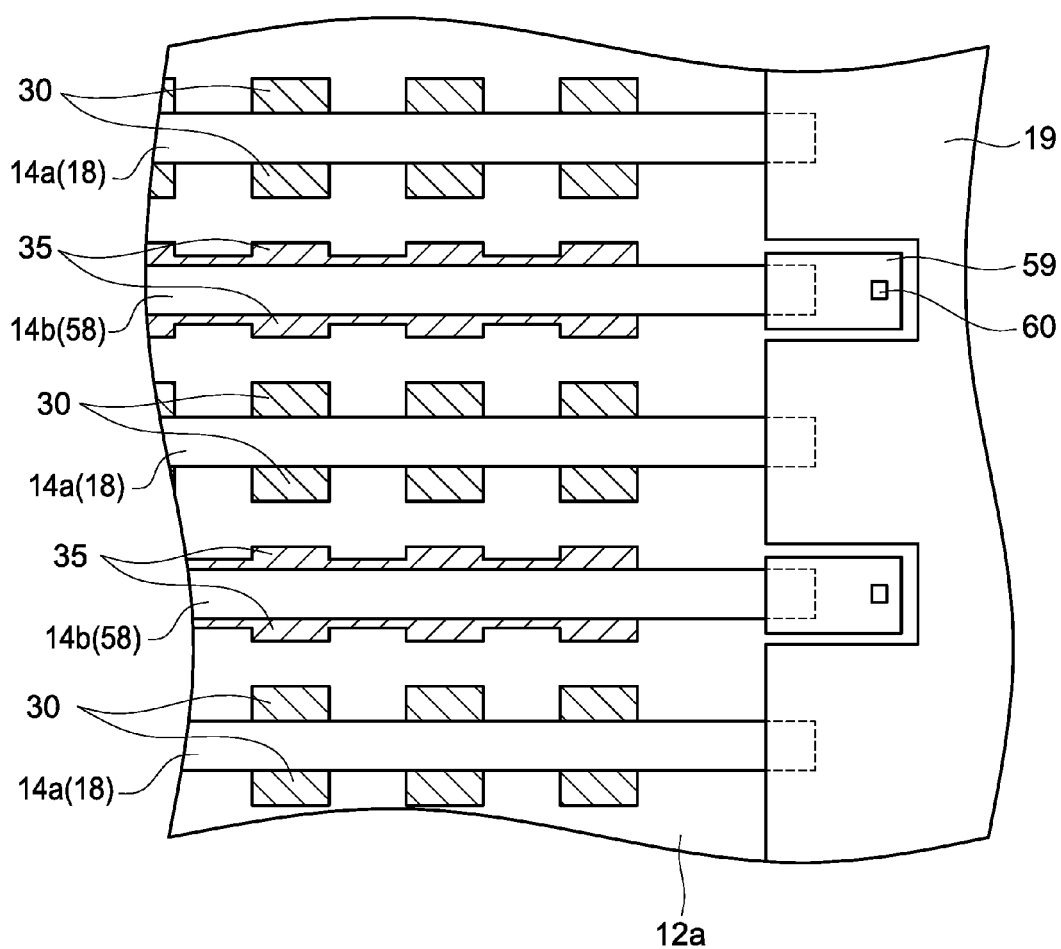
FIG. 4 shows a top view of a semiconductor device in a variation (Notably, only the elements necessary for description are shown)

A variation of the semiconductor device 10 in Embodiment 1 will hereinafter be described. As shown in FIG. 2, in the semiconductor device 10 in Embodiment 1, each pillar region 35 is formed continuously along the dummy trench 14b, with a constant width, when the upper surface 12a of the semiconductor substrate 12 is seen. As shown in FIG. 3, however, each pillar region 35 may be formed intermittently along the dummy trench 14b. Moreover, as shown in FIG. 4, the width of each pillar region 35 may be changed depending on positions.

Figure 5:
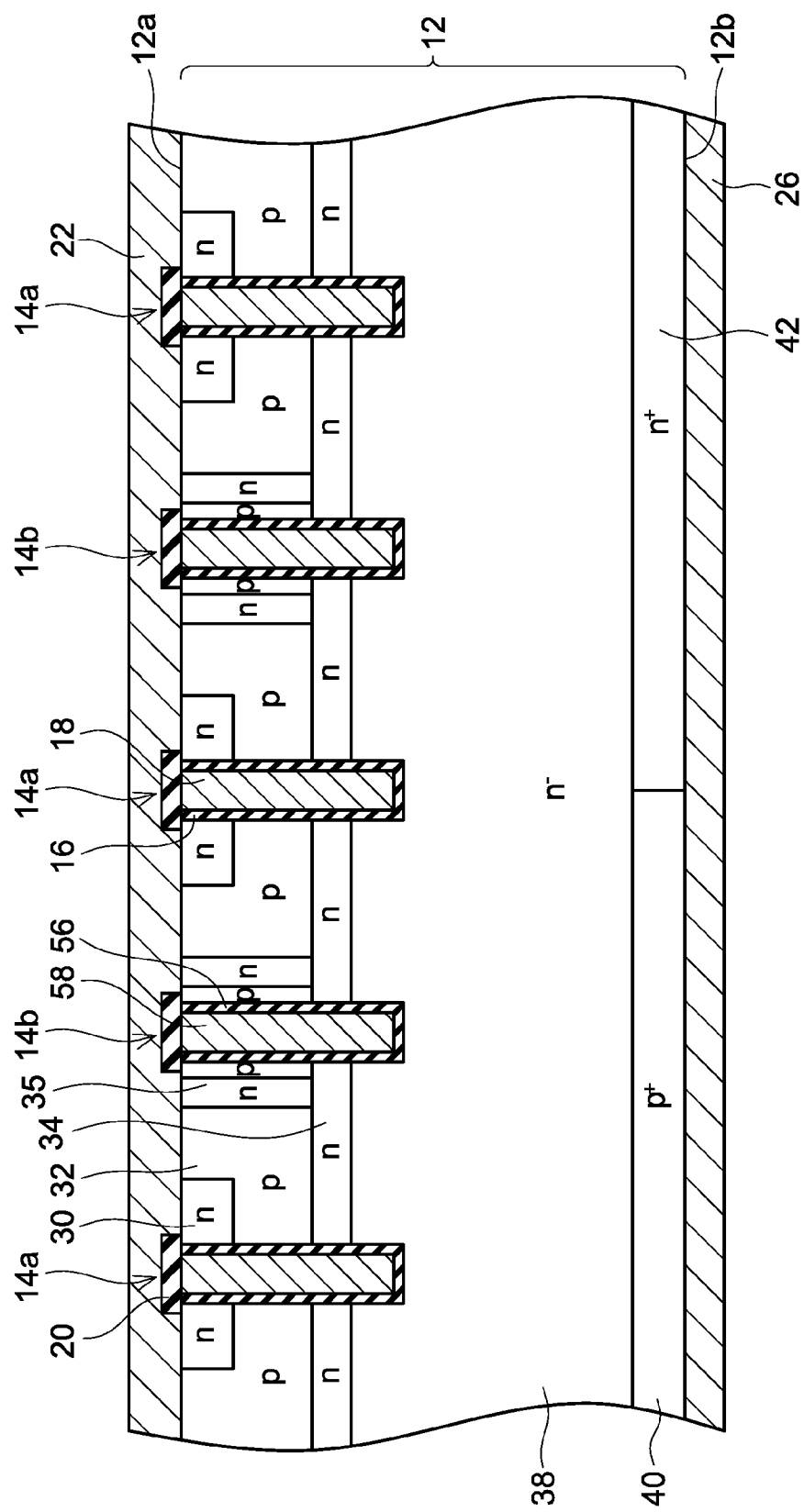
FIG. 5 shows a vertical cross-sectional view of a semiconductor device in a variation.
Figure 6:
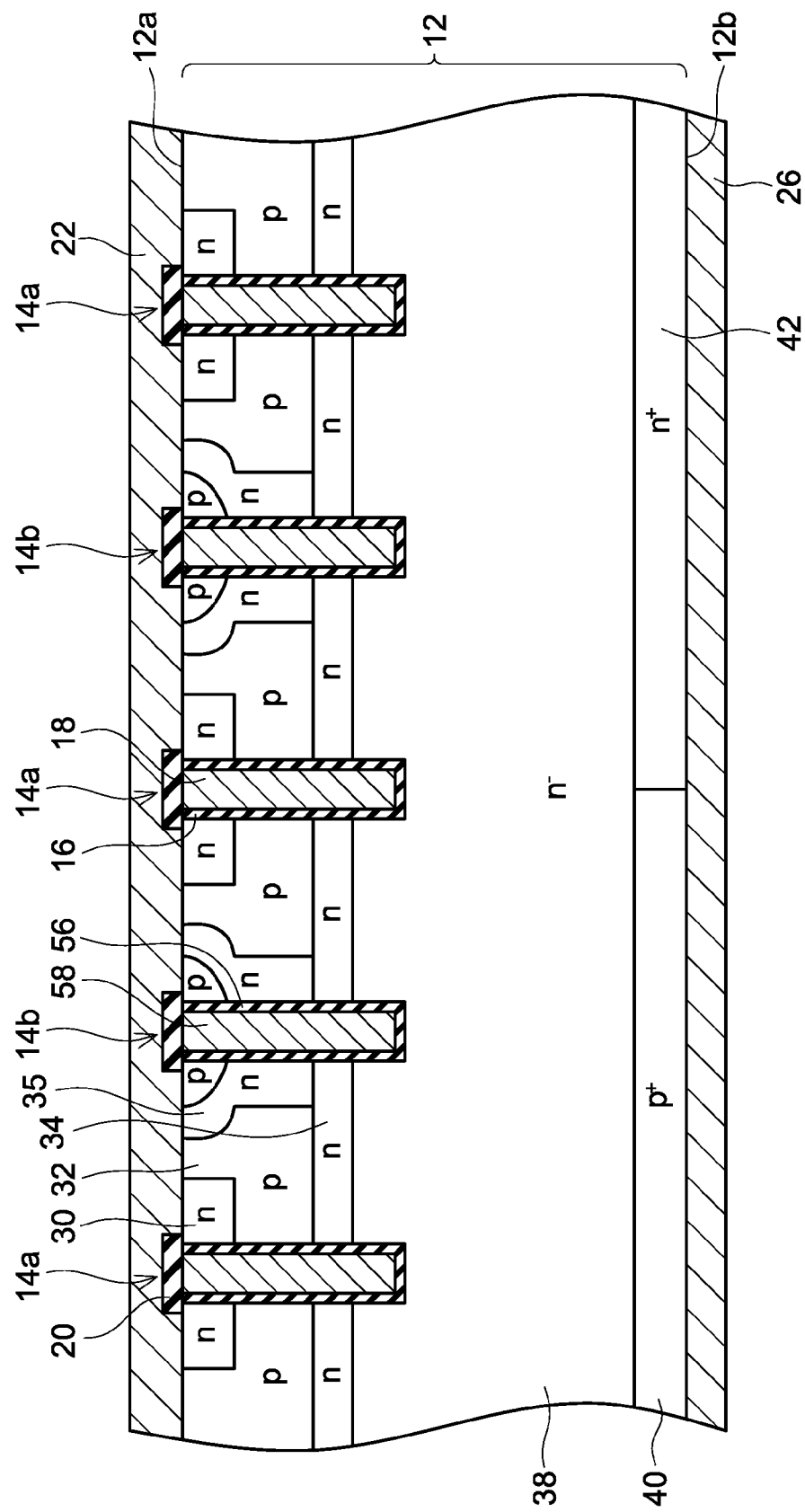
FIG. 6 shows a vertical cross-sectional view of a semiconductor device in a variation.

Moreover, in the semiconductor device 10 in Embodiment 1, each pillar region 35 is in contact with the dummy insulating film 56, in the entirety of its depth range. As shown in FIG. 5, however, each pillar region 35 may be formed at a position apart from the corresponding dummy insulating film 56. In this case, each spacing between the pillar region 35 and the dummy insulating film 56 is preferably made as narrow as possible. For example, each spacing between the pillar region 35 and the dummy insulating film 56 is preferably made narrower than each spacing between the pillar region 35 and the gate insulating film 16. Moreover, as shown in FIG. 6, each pillar region 35 may be in contact with the dummy insulating film 56, in a portion of its depth range.

Figure 7:
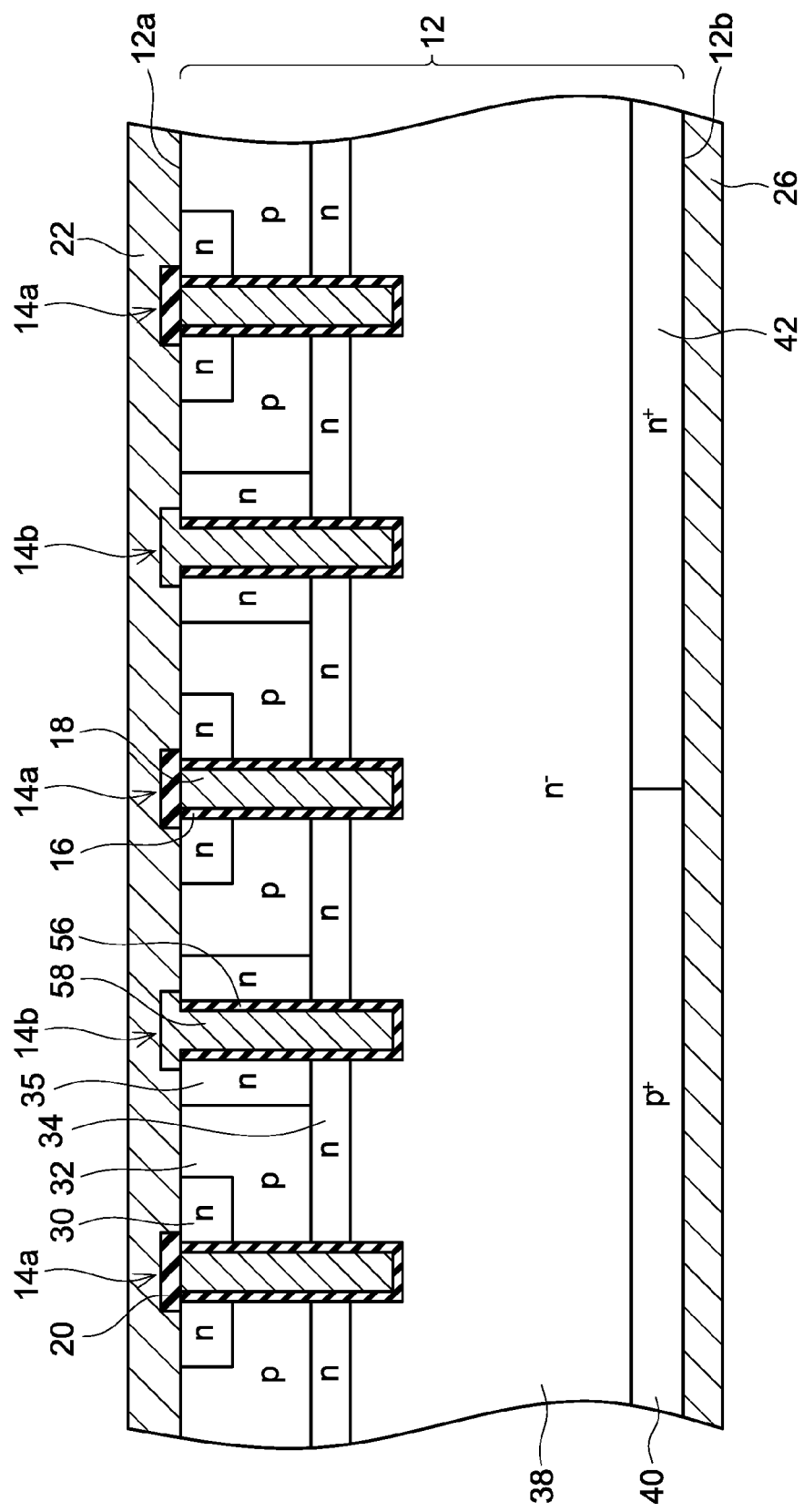
FIG. 7 shows a vertical cross-sectional view of a semiconductor device in a variation.
Figure 8:
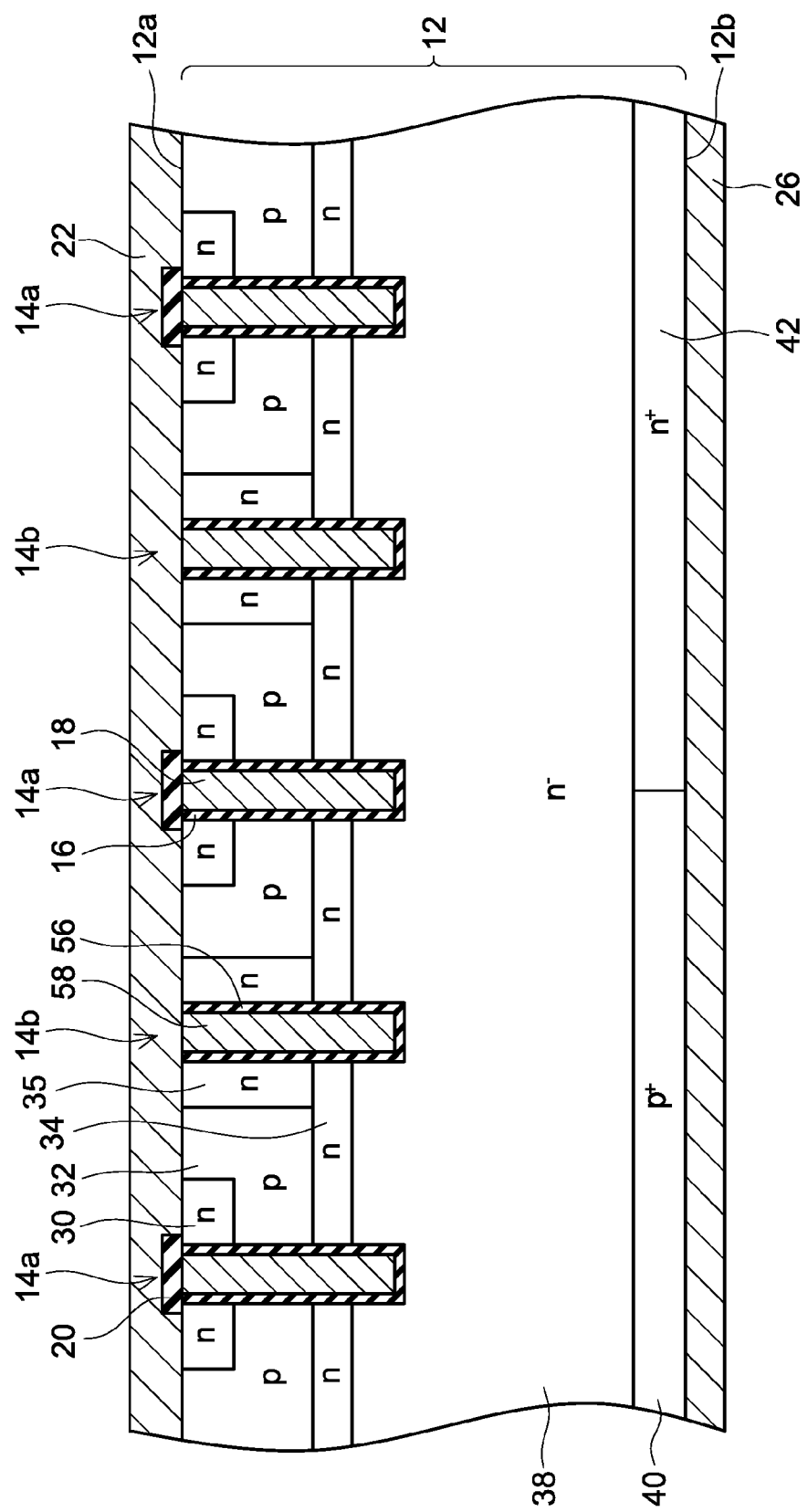
FIG. 8 shows a vertical cross-sectional view of a semiconductor device in a variation.

Moreover, in the semiconductor device 10 in Embodiment 1, each dummy electrode 58 is electrically connected to the upper electrode 22, at an end portion of each dummy trench 14b in the longitudinal direction. As shown in FIGS. 7 and 8, however, the interlayer insulating film 20 may be removed from an upper portion of each dummy electrode 58, and each dummy electrode 58 may be connected to the upper electrode 22 by its upper surface. Notably, in an example in FIG. 7, polysilicon that configures each dummy electrode 58 is partially formed on the upper surface 12a of the semiconductor substrate 12, and the polysilicon and the upper electrode 22 are connected on the upper surface 12a. Moreover, in an example in FIG. 8, polysilicon that configures each dummy electrode 58 is formed exclusively in the dummy trench 14b, and the upper electrode 22 is connected to the polysilicon in each dummy trench 14b.

Moreover, in the semiconductor device 10 in Embodiment 1, each pillar region 35 is in Schottky-contact with the upper electrode 22. However, each pillar region 35 may be in ohmic contact with the upper electrode 22. In such a configuration, a current path configured with the pillar region 35, the barrier region 34, the drift region 38, and the cathode region 42 functions not as an SBD, but as a resistor connected between the upper electrode 22 and the lower electrode 26. In this case as well, when the potential of the upper electrode 22 is raised, a current flows in the current path that functions as a resistor, and then the pn diode is turned on, and hence the timing at which the pn diode is turned on can be delayed. In other words, a flow of holes into the drift region 38 can be suppressed. Consequently, in this configuration as well, the reverse recovery current of the diode can be suppressed.

Moreover, in the semiconductor device 10 in Embodiment 1, each dummy electrode 58 is electrically connected to the upper electrode 22. However, each dummy electrode 58 may be insulated from the upper electrode 22. In other words, the potential of each dummy electrode 58 may not be fixed to the potential of the upper electrode 22, and may be set at a floating potential.

Figure 9:
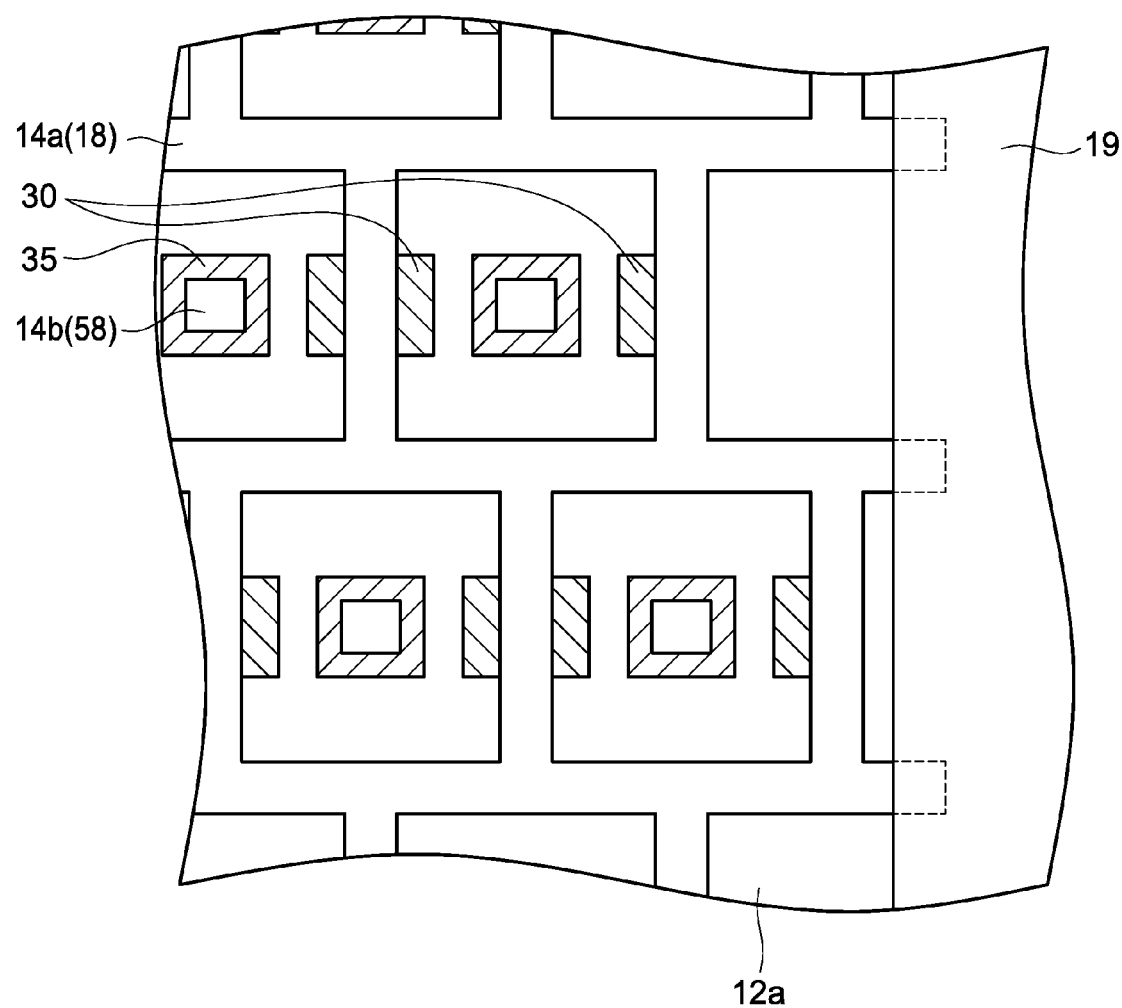
FIG. 9 shows a top view of a semiconductor device in a variation (Notably, only the elements necessary for description are shown)
Figure 10:
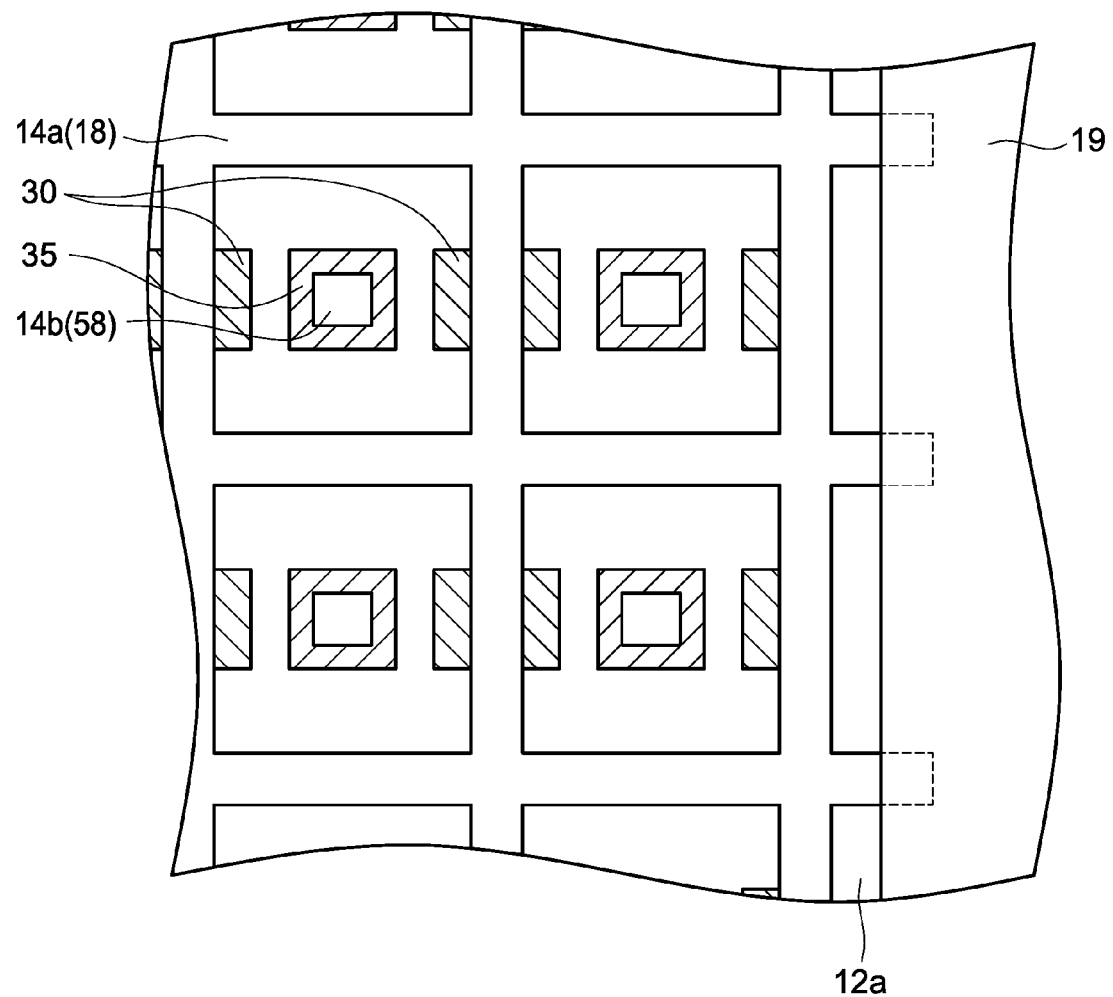
FIG. 10 shows a top view of a semiconductor device in a variation (Notably, only the elements necessary for description are shown)
Figure 11:
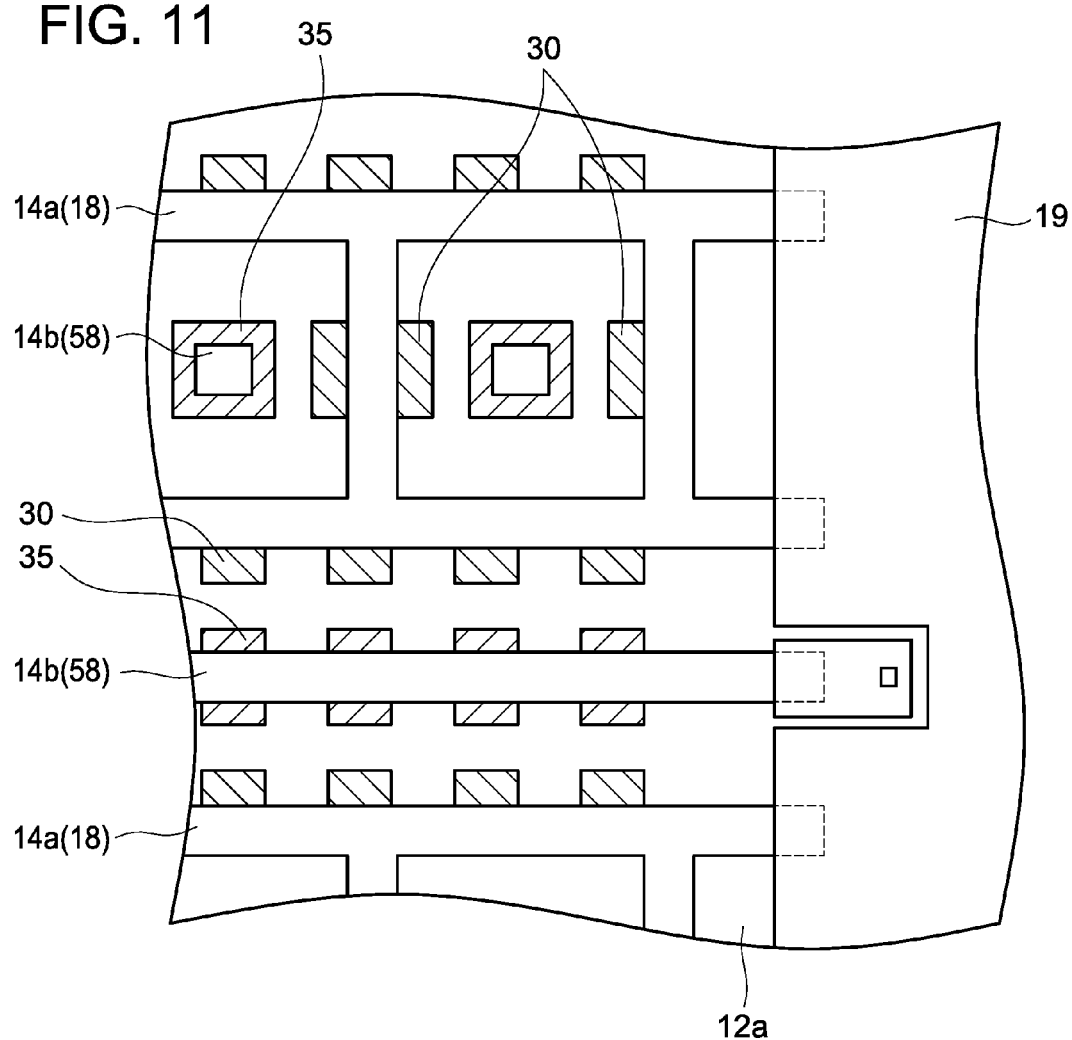
FIG. 11 shows a top view of a semiconductor device in a variation (Notably, only the elements necessary for description are shown)

Moreover, in the semiconductor device 10 in Embodiment 1, each gate trench 14a extends in a stripe-like manner. As shown in FIGS. 9 and 10, however, the gate trench 14a may extend in a grid-like manner, and each dummy trench 14b may be formed in a range surrounded by the gate trench 14a. Even if each region is located as in FIGS. 9 and 10, the IGBT and the diodes can operate as in Embodiment 1. Moreover, as shown in FIG. 11, each dummy trench 14b which is like a stripe and each gate trench 14a which is like a grid may be combined and arranged.

Figure 12:
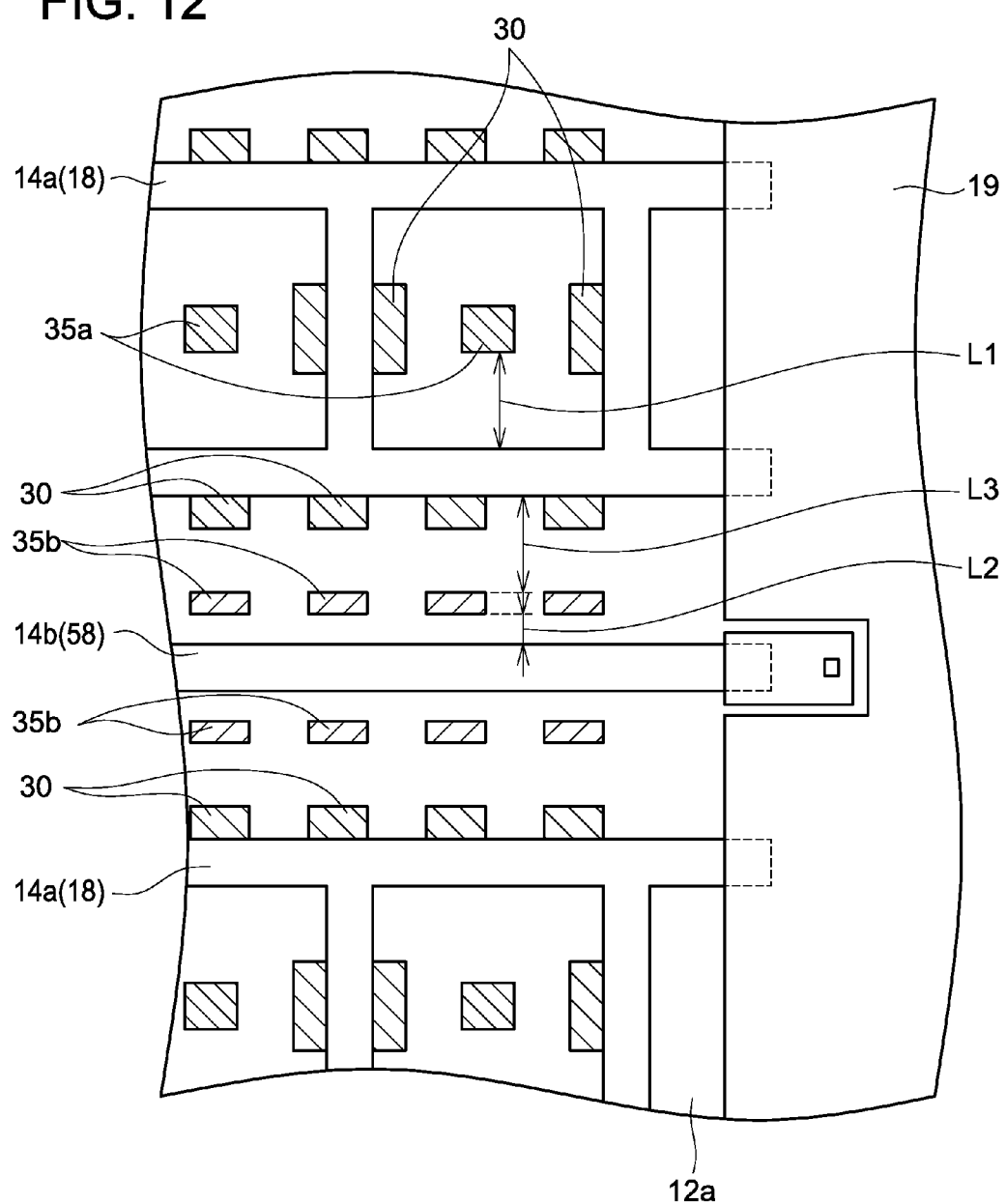
FIG. 12 shows a top view of a semiconductor device in a variation (Notably, only the elements necessary for description are shown)

Moreover, the stripe-like dummy trenches 14b and the grid-like gate trenches 14a may be formed as shown in FIG. 12. In FIG. 12, each of the emitter regions 30 and each of the pillar regions 35 (the pillar regions 35a) are formed in a range surrounded by the corresponding grid-like gate trench 14a. In the range surrounded by the grid-like gate trench 14a, the dummy trench 14b is not formed. The pillar region 35a is formed at a center of the range surrounded by the grid-like gate trench 14a. A distance from the pillar region 35a to the gate trench 14a is a distance L1. The dummy trench 14b is formed outside the range surrounded by the grid-like gate trench 14a. The emitter regions 30 and the pillar regions 35 (the pillar region 35b) are formed between the dummy trench 14b and the gate trench 14a. Each of the pillar regions 35b is formed at a position apart from the dummy trench 14b. A distance between the pillar region 35b and the dummy trench 14b is a distance L2. A distance between the pillar region 35b and the gate trench 14a is a distance L3. The distance L2 is shorter than the distance L1, and shorter than the distance L3. Even in this configuration, the pillar region 35b is located close to the dummy trench 14b, and hence the effects similar to those in Embodiment 1 described above can be obtained.

Figure 13:
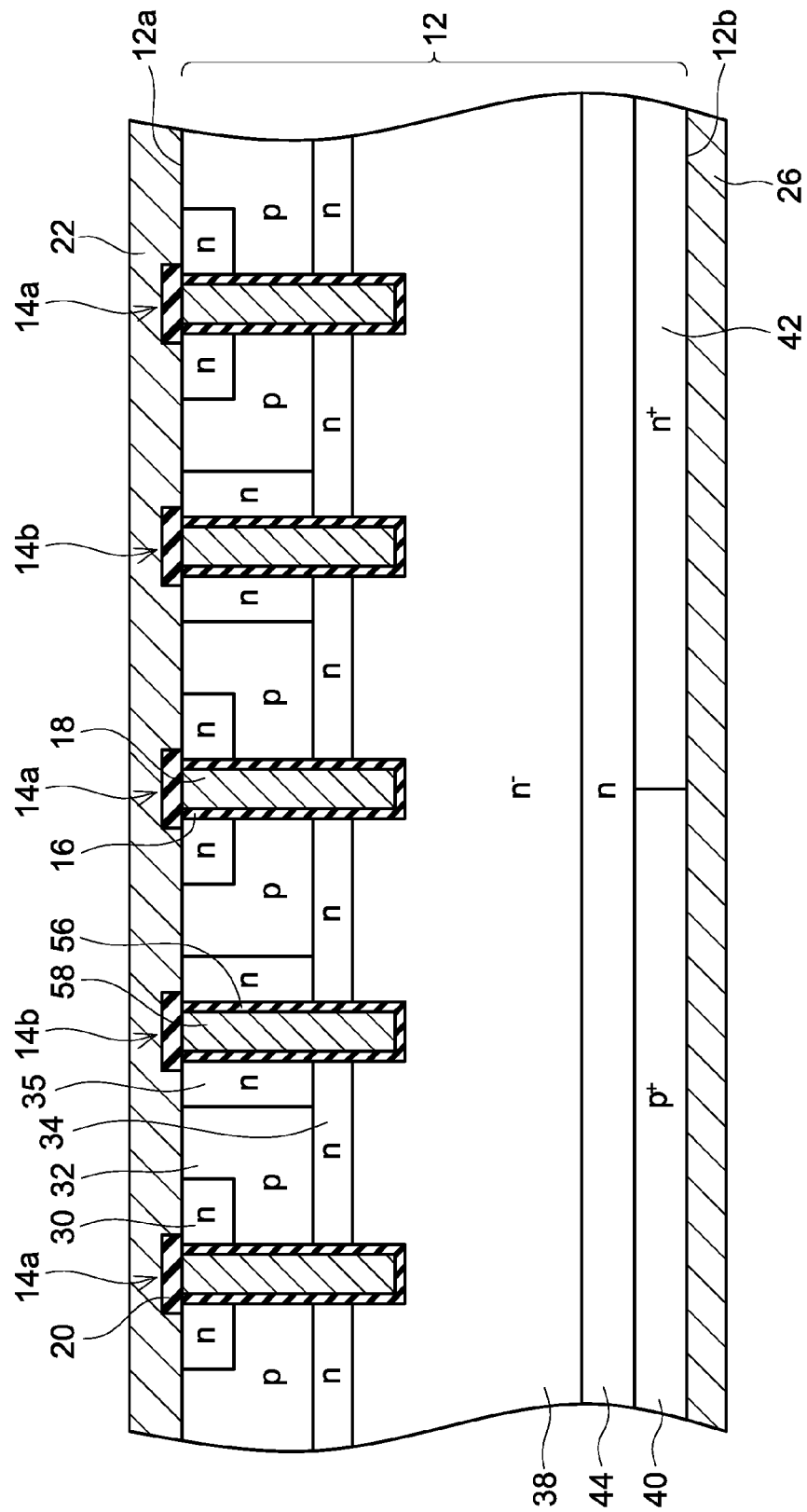
FIG. 13 shows a vertical cross-sectional view of a semiconductor device in a variation.

Moreover, in the semiconductor device 10 in Embodiment 1, the collector region 40 and the cathode region 42 are in contact with the drift region 38. As shown in FIG. 13, however, a buffer region 44 may be formed under the drift region 38. The buffer region 44 is an n-type region that contains phosphorus as impurities. The buffer region 44 is the n-type region that has a density of n-type impurities higher than that in the drift region and lower than that in the cathode region 42. The collector region 40 and the cathode region 42 are formed under the buffer region 44. The collector region 40 and the cathode region 42 are separated from the drift region 38 by the buffer region 44. The buffer region 44 has a density of n-type impurities of approximately $1\times10^{15}$ to $1\times10^{18}/cm^3$. The buffer region 44 has a thickness of approximately 0.2 to 5.0 μm.

Embodiment 2

Figure 14:
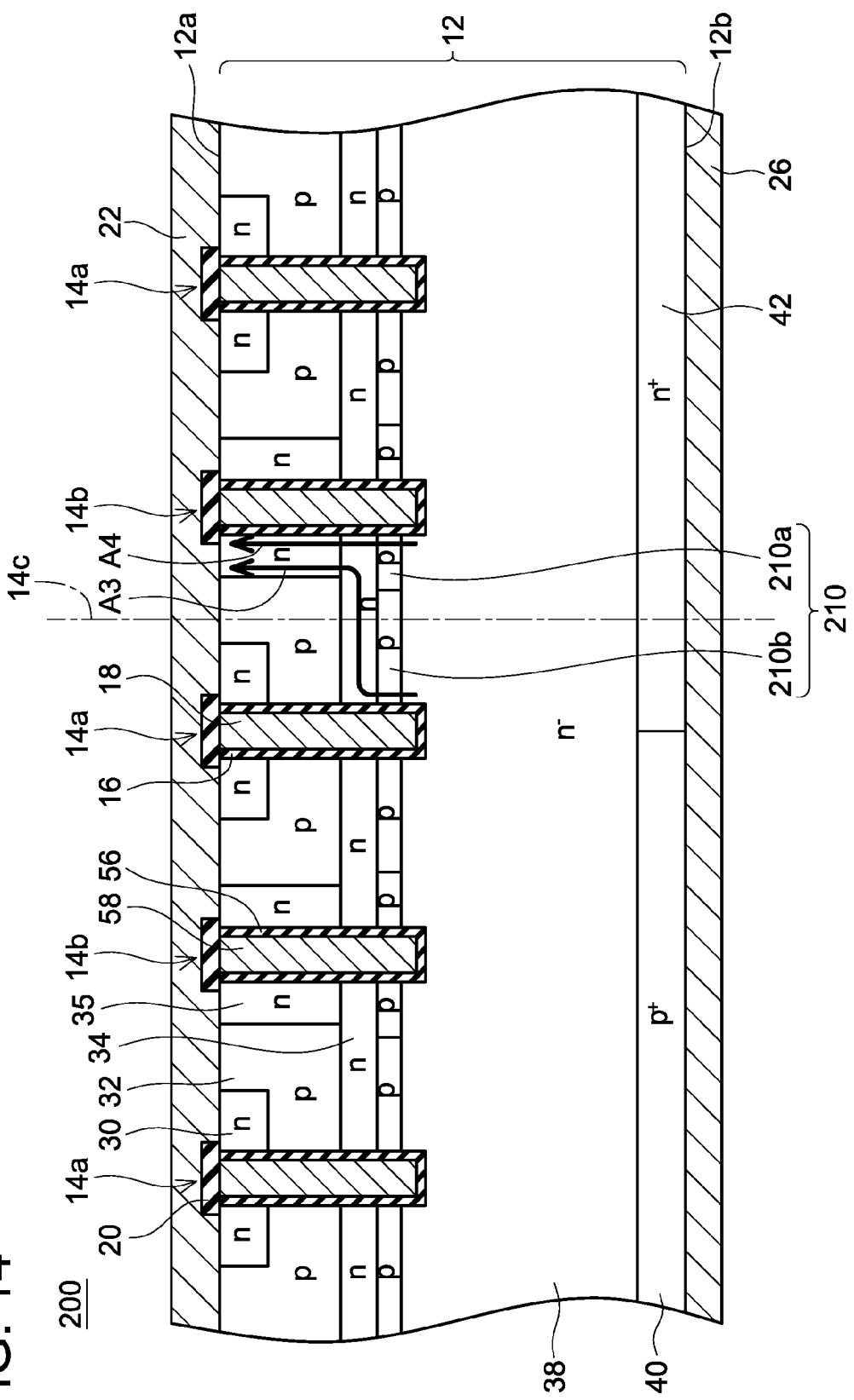
FIG. 14 shows a vertical cross-sectional view of a semiconductor device 200 in Embodiment 2.

A semiconductor device 200 in Embodiment 2 shown in FIG. 14 differs from the semiconductor device 10 in Embodiment 1 in that it has intermediate regions 210 of p-type. Other configurations of the semiconductor device 200 in Embodiment 2 are the same as those of the semiconductor device 10 in Embodiment 1. Each intermediate region 210 is a p-type region that contains boron as impurities. The intermediate region 210 is formed between the barrier region 34 and the drift region 38. The middle region 210 is formed between the gate trench 14a and the dummy trench 14b. The intermediate region 210 is in contact with the gate insulating film 16 under the barrier region 34, and in contact with the dummy insulating film 56 under the barrier region 34. The barrier region 34 is separated from the drift region 38 by the intermediate region 210. The intermediate region 210 has a density of p-type impurities of approximately $1\times10^{15}$ to $1\times10^{18}/cm3$. The intermediate region 210 has a thickness of approximately 0.2 to 3.0 μm.

The intermediate region 210 has a high-density region 210a that has a high density of p-type impurities and a low-density region 210b that has a low density of p-type impurities. The high-density region 210a is formed at a position in the intermediate region 210, adjacent to the dummy trench 14b. The low-density region 210b is formed at a position in the intermediate region 210, adjacent to the gate trench 14a. Accordingly, an average value of a density of p-type impurities in a portion of the intermediate region 210 closer to the dummy trench 14b than a center position 14c between the gate trench 14a and the dummy trench 14b is higher than an average value of a density of p-type impurities in a portion of the intermediate region 210 closer to the gate trench 14a than the intermediate position 14c.

Notably, a square area density of p-type impurities in the low-density region 210b (a value obtained by integrating the densities of p-type impurities in the intermediate region 210 in the thickness direction) is preferably equal to or higher than $1\times10^{12}/cm^2$, and a square area density of p-type impurities in the high-density region 210a is preferably a value higher than the square area density of p-type impurities in the low-density region 210b (i.e., approximately $2\times10^{12}$ to $1\times10^{14}/cm^2$). If the square area density of p-type impurities in the intermediate region 210 is equal to or higher than $1\times10^{12}/cm^2$ as such, there occurs no case where the intermediate region 210 is completely depleted in the thickness direction, even if a high voltage is applied to the semiconductor device 200.

An operation of the IGBT in the semiconductor device 200 will be described. When the IGBT is to be turned on, a potential higher than that of the upper electrode 22 is applied to the lower electrode 26. When a potential equal to or higher than the threshold value is applied to the gate electrode 18, a channel is formed in the body region 32 and the middle region 210, in the proximity of the gate insulating film 16. As a result, electrons flow from the upper electrode 22 toward the lower electrode 26 through the emitter region 30, the channel in the body region 32, the barrier region 34, the channel in the intermediate region 210, the drift region 38, and the collector region 40. Moreover, holes flow from the lower electrode 26 toward the upper electrode 22 through the collector region 40, the drift region 38, the intermediate region 210, the barrier region 34, and the body region 32. In the semiconductor device 200 in Embodiment 2 as well, a spacing between the gate trench 14a and the dummy trench 14b is narrow, and hence the carrier accumulation effect can sufficiently be obtained. Accordingly, the on-voltage of this IGBT is low.

Afterwards, when the potential of the gate electrode 18 is lowered to a potential less than the threshold value, the channel disappears, and a current stops. In other words, the IGBT is turned off. In the semiconductor device 10 in Embodiment 2, a leakage current while the IGBT is off is suppressed. The details thereof will hereinafter be described. In the semiconductor device 10 in Embodiment 1, while the IGBT is off, there may be a case, as indicated by arrows A1 and A2 in FIG. 1, where a leakage current flows from the drift region 38 toward the upper electrode 22 via the barrier region 34 and the pillar region 35. In contrast, in the semiconductor device 200 in Embodiment 2, the p-type intermediate region 210 is formed between the barrier region 34 and the drift region 38. A pn junction at an interface between the drift region 38 and the intermediate region 210 serves as a barrier, and hence a leakage current is suppressed in the semiconductor device 200 in Embodiment 2. Notably, even if the intermediate region 210 is provided as such, there may be a case where a leakage current flows beyond the intermediate region 210. Such a leakage current usually flows through the intermediate region 210 in the proximity of the gate insulating film 16 or through the intermediate region 210 in the proximity of the dummy insulating film 56. In the semiconductor device 200 in Embodiment 2, a path indicated by an arrow A3 in FIG. 14 is a path of the leakage current that passes through the intermediate region 210 in the proximity of the gate insulating film 16, and a path indicated by an arrow A4 in FIG. 14 is a path of the leakage current that flows through the intermediate region 210 in the proximity of the dummy insulating film 56. In the path indicated by the arrow A4, the density of p-type impurities in the intermediate region 210 (i.e., the high-density region 210a) is high. Accordingly, a barrier of the pn junction at the interface between the intermediate region 210 and the drift region 38 is large. This makes it difficult for a leakage current to flow in the path indicated by the arrow A4. Moreover, in the path indicated by the arrow A3, the density of p-type impurities in the intermediate region 210 (i.e., the low-density region 210b) is low. This is because a channel needs to be formed in the proximity of the gate insulating film 16 when the IGBT is turned on, and the density of p-type impurities in the intermediate region 210 cannot be set so high. Consequently, in the path indicated by the arrow A3, a barrier of the pn junction at the interface between the middle region 210 and the drift region 38 is small. However, in the path indicated by the arrow A3, a path that passes through the barrier region 34 is long. The barrier region 34 has an electrical resistance of a certain level, and hence providing a long path that passes through the barrier region 34 makes it difficult for a leakage current to flow in the path indicated by the arrow A3.

As described above, in the semiconductor device 200 in Embodiment 2, the pillar region 35 is located at a position apart from the gate trench 14a to ensure that the path indicated by the arrow A3 is long, to thereby suppress a leakage current flowing in the path indicated by the arrow A3. Moreover, the density of p-type impurities in the intermediate region 210 in the proximity of the dummy trench 14b is high, to thereby suppress a leakage current flowing in the path indicated by the arrow A4. Moreover, no channel is formed in the proximity of the dummy trench 14b, and hence even if the density of p-type impurities in the intermediate region 210 is high, no particular problem occurs.

Moreover, in the semiconductor device 200 in Embodiment 2, while the IGBT is on, a flow of a leakage current in each of the paths indicated by the arrows A3 and A4 is also suppressed. If a current flows in the paths indicated by the arrows A3 and A4 while the IGBT is on, the IGBT may perform an unexpected operation. In the semiconductor device 200 in Embodiment 2, however, such an operation can be prevented.

Next, an operation of the diodes will be described. The thickness of the intermediate region 210 is small, and the density of p-type impurities in the intermediate region 210 is not so high, and hence while the SBD and the pn diode operate, electrons and holes can flow beyond the intermediate region 210. Consequently, even in the semiconductor device 200 in Embodiment 2, the SBD and the pn diode operate as in the semiconductor device 10 in Embodiment 1.

Figure 15:
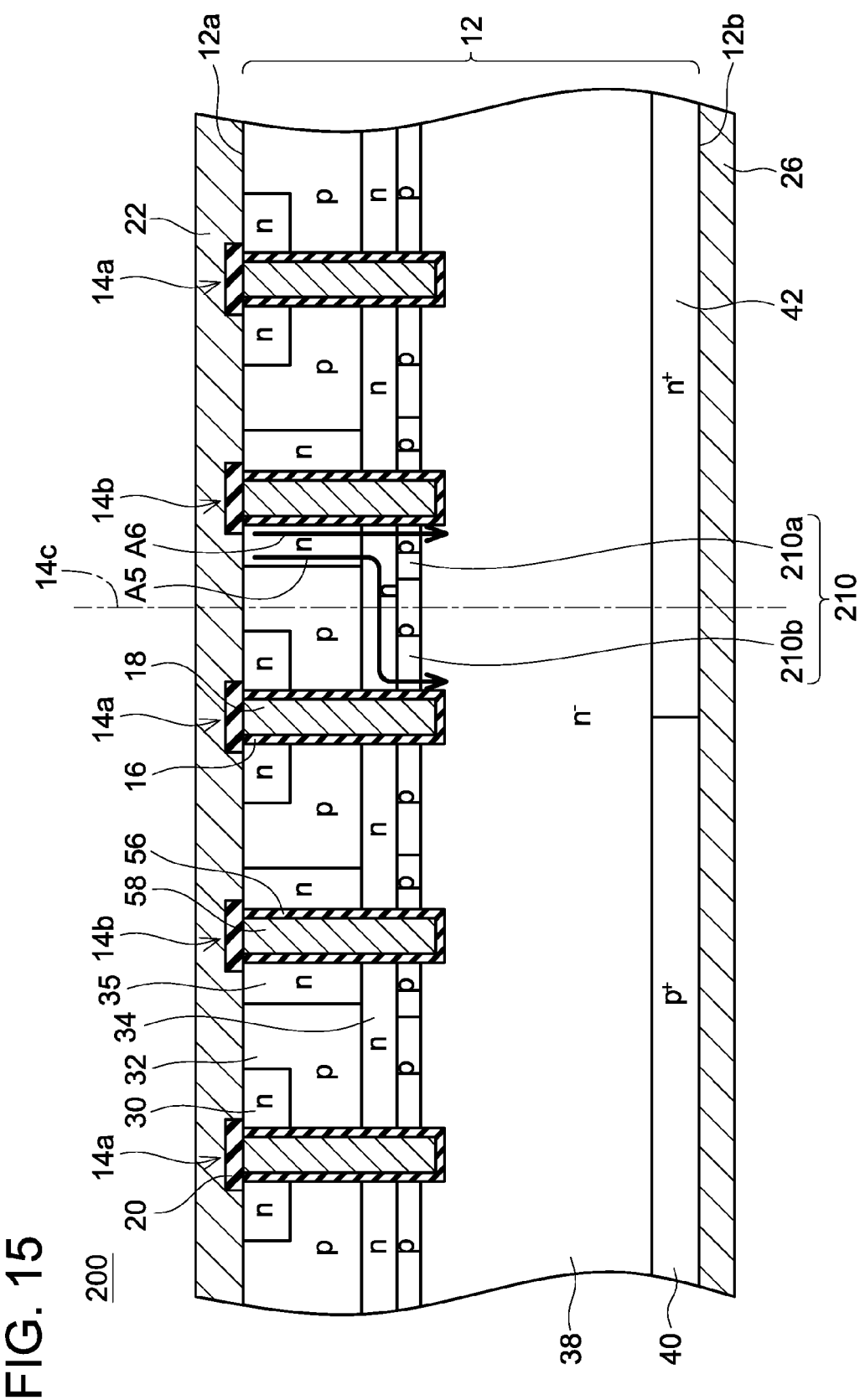
FIG. 15 shows a vertical cross-sectional view of the semiconductor device 200 in Embodiment 2 (a diagram that shows the same cross-section as that in FIG. 14)

A current that flows in the SBD when the diode operates easily flows through the proximity of the gate insulating film 16 and the proximity of the dummy insulating film 56, as indicated by arrows A5 and A6 in FIG. 15. Here, if a current that flows through the proximity of the dummy insulating film 56 as indicated by the arrow A6 is large, a potential difference is less easily generated between the upper electrode 22 and the barrier region 34, and this makes it more difficult than necessary for the pn diode (i.e., the pn junction at an interface between the body region 32 and the barrier region 34) to be turned on. In contrast, in the semiconductor device 200 in Embodiment 2, the density of p-type impurities in the intermediate region 210 in the proximity of the dummy insulating film 56 (i.e., the high-density region 210a) is high, and a current indicated by the arrow A6 is thereby suppressed. In other words, if the density of p-type impurities in the intermediate region 210 in the proximity of the dummy insulating film 56 is high, the barrier becomes large at the pn junction at the interface between this intermediate region 210 and the barrier region 34. Accordingly, a current that flows as indicated by the arrow A6 is suppressed. As a result, a current that flows as indicated by the arrow A5 is increased, enabling the pn diode to be turned on at an appropriate timing.

The semiconductor device 200 in Embodiment 2 has been described above. Notably, a configuration of each of the various variations described in relation to Embodiment 1 may be applied to the semiconductor device 200 in Embodiment 2.

Figure 16:
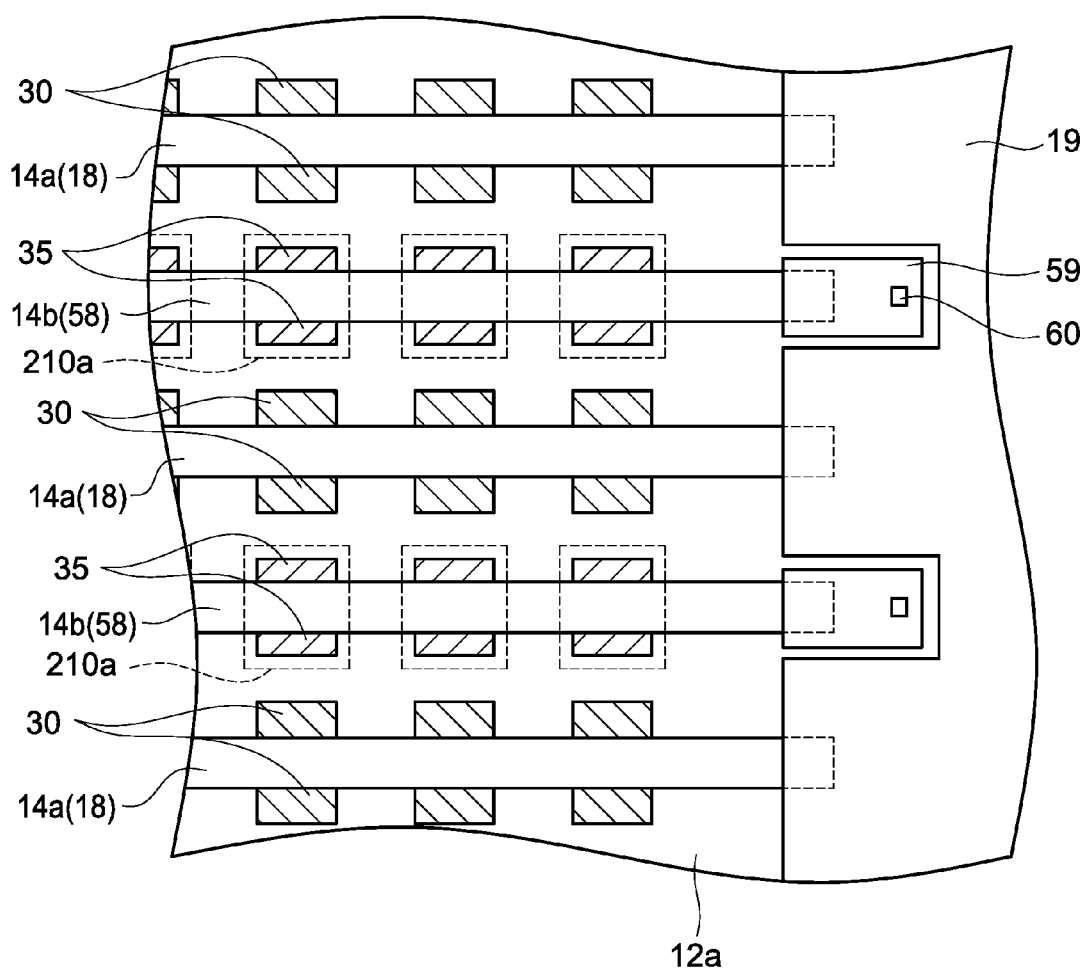
FIG. 16 shows a top view of a semiconductor device in a variation (Notably, only the elements necessary for description are shown)
Figure 17:
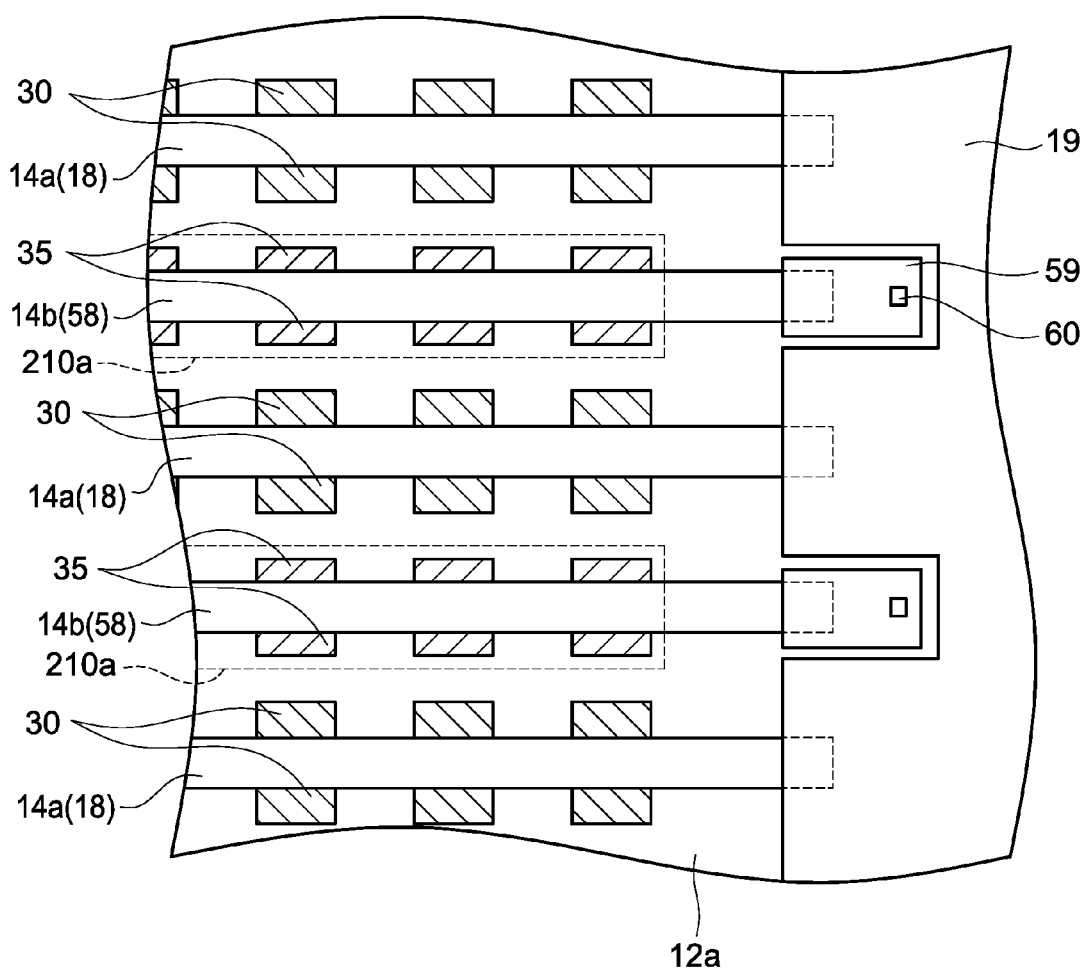
FIG. 17 shows a top view of a semiconductor device in a variation (Notably, only the elements necessary for description are shown)
Figure 18:
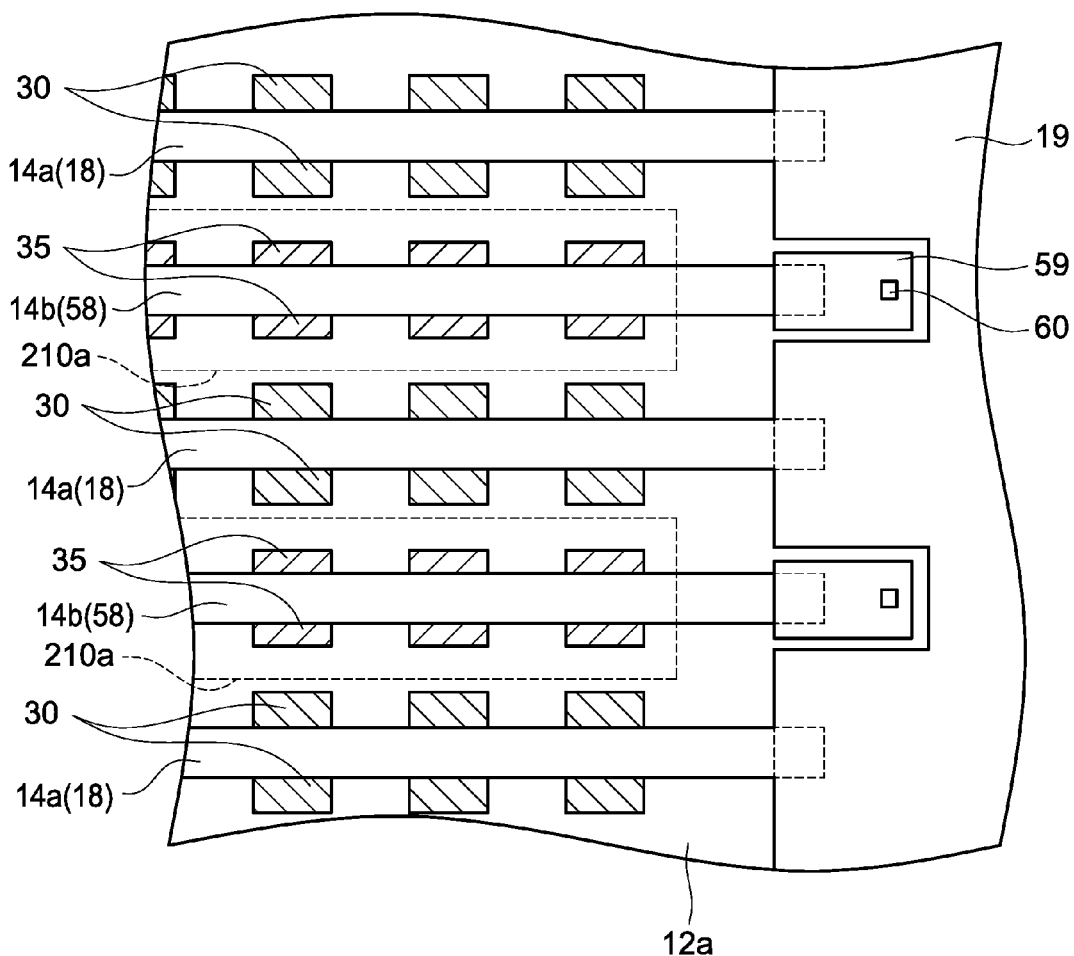
FIG. 18 shows a top view of a semiconductor device in a variation (Notably, only the elements necessary for description are shown)

Notably, in Embodiment 2, the high-density region 210a is preferably formed in a range immediately below the pillar region 35, and more preferably formed in a range wider than the range immediately below the pillar region 35. For example, in the case where the pillar region 35 is formed intermittently along the dummy trench 14b, the range of the high-density region 210a, when the upper surface of the semiconductor substrate 12 is seen, is preferably made wider than the range of the pillar region 35, as shown in FIGS. 16 and 17. Moreover, as shown in FIG. 18, approximately the entire region between the gate trench 14a and the dummy trench 14b may be set as the high-density region 210a, and only the proximity of the gate trench 14a may be set as the low-density region 210b.

Embodiment 3

Figure 19:
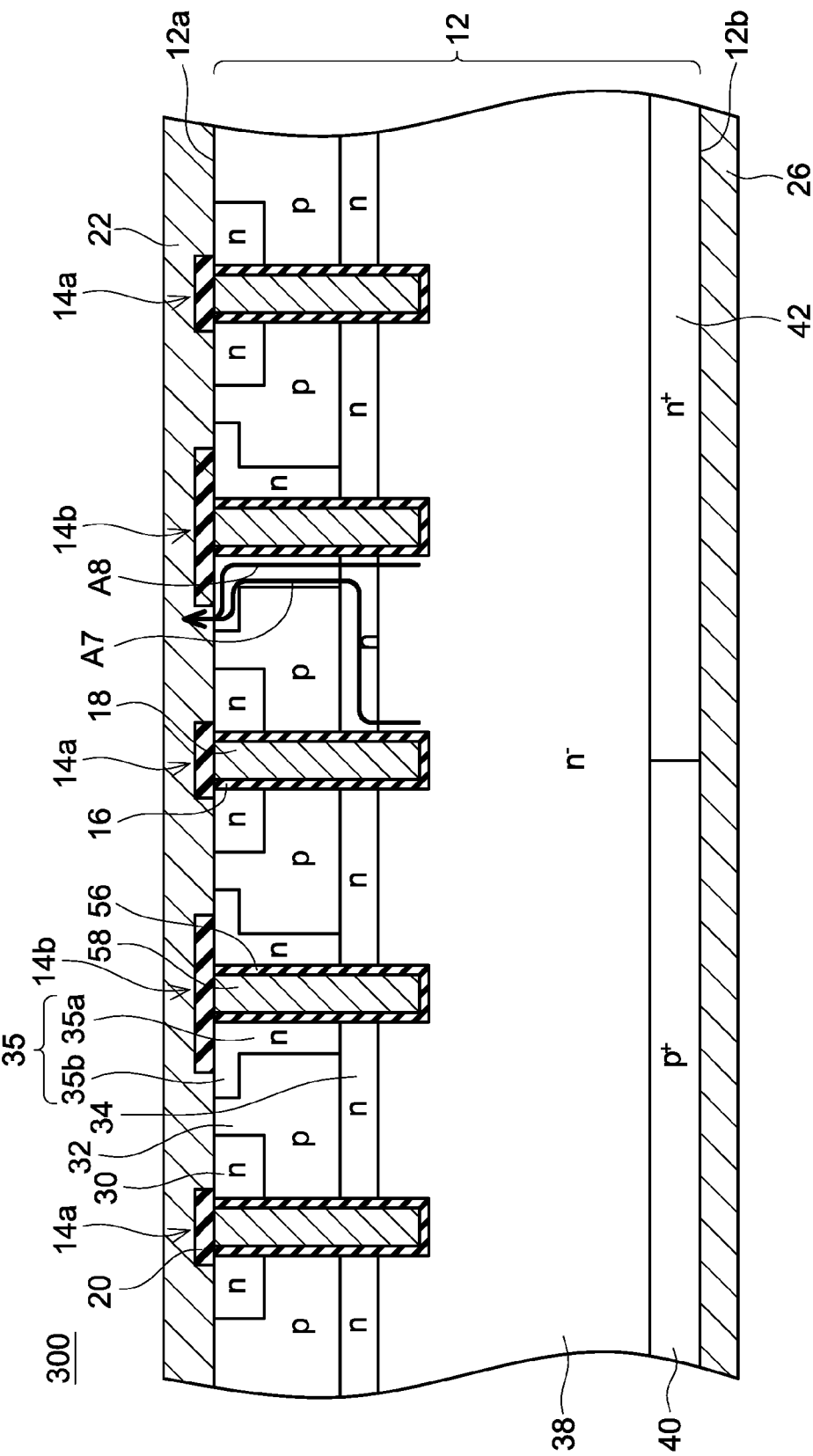
FIG. 19 shows a vertical cross-sectional view of a semiconductor device 300 in Embodiment 3.

In a semiconductor device 300 in Embodiment 3 shown in FIG. 19, the configuration of the pillar regions 35 differs from that of the semiconductor device 10 in Embodiment 1. Other configurations of the semiconductor device 300 in Embodiment 3 are the same as those of the semiconductor device 10 in Embodiment 1.

In the semiconductor device 300 in Embodiment 3, each of the pillar regions 35 has a first portion 35a extending from the barrier region 34 along an upward direction, and a second portion 35b extending from the first portion 35a along a direction moving away from the dummy trench 14b. An upper end portion of the first portion 35a is covered with the interlayer insulating film 20. An end portion of the second portion 35b on the gate trench 14a side is not covered with the interlayer insulating film 20, and is Schottky-connected to the upper electrode 22.

In the semiconductor device 300 in Embodiment 3, the end portion of the second portion 35b is connected to the upper electrode 22, and the upper end portion of the first portion 35a is not connected to the upper electrode 22. Accordingly, as indicated by arrows A7 and A8 in FIG. 19, a path of the leakage current is longer than the paths in Embodiment 1 (the arrows A1 and A2). Accordingly, a leakage current can be suppressed.

Notably, it can also be considered that the path of a leakage current is made long by increasing a dimension of the pillar region 35 in the depth direction (i.e., the thickness of the body region 32). However, if such a pillar region 35 is to be formed, high-energy ion implantation is required, causing damages to the semiconductor substrate 12. By allowing a front surface portion of the pillar region 35 to partially extend in the lateral direction as in Embodiment 3, the resistance of the path of a leakage current can be made high, without increasing the dimension of the pillar region 35 in the depth direction.

The semiconductor device 300 in Embodiment 3 has been described above. Notably, a configuration of each of the various variations described in relation to Embodiment 1 may be applied to the semiconductor device 300 in Embodiment 3.

Notably, in the case where the pillar region 35 is brought into Schottky-contact with the upper electrode 22, it is difficult to stably form a barrier height. In this case where the barrier height is low, or in the case where the pillar region 35 is brought into ohmic contact with the upper electrode 22, suppressing a leakage current by the second portion 35b as in Embodiment 3 is more effective.

Figure 20:
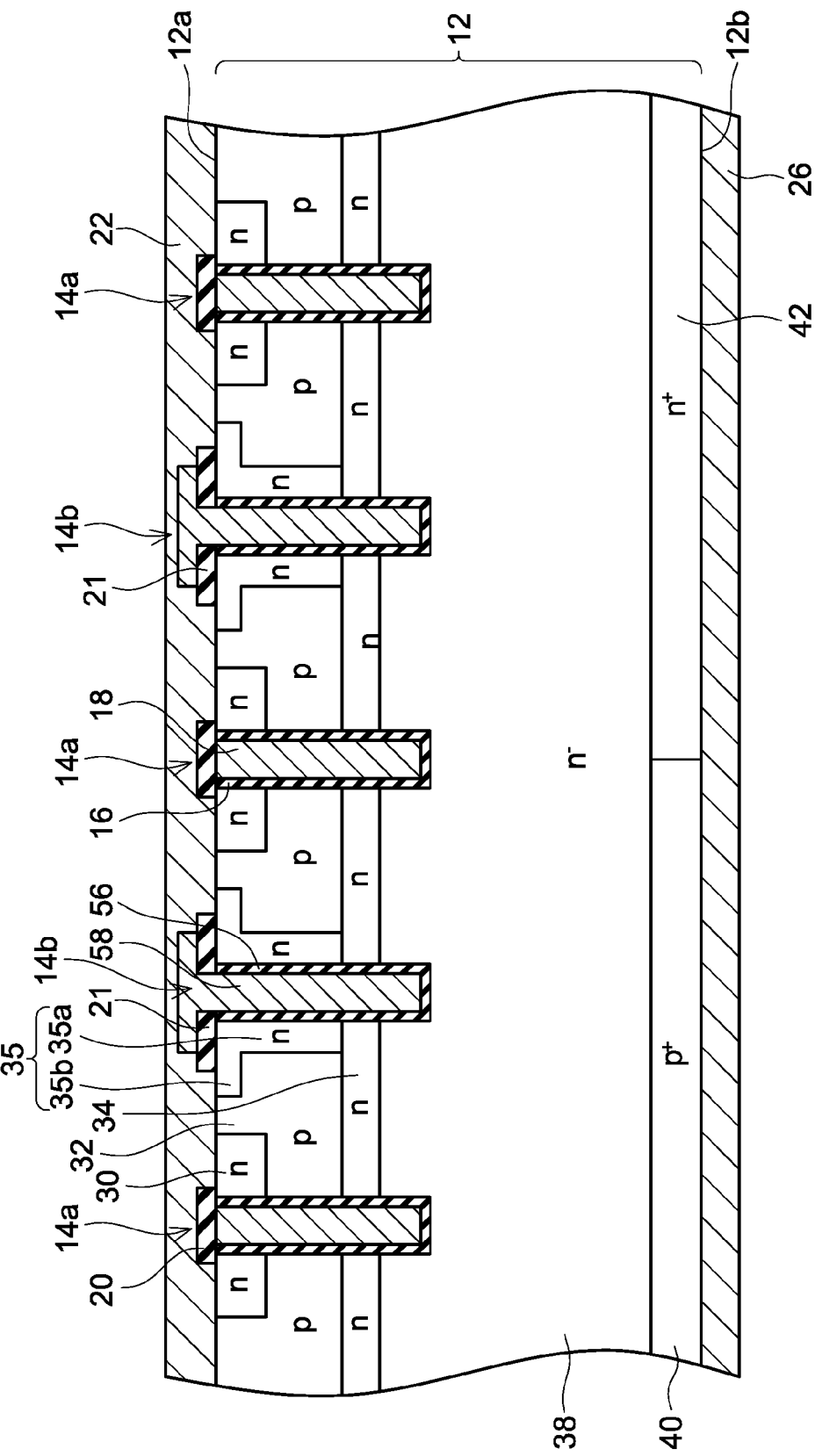
FIG. 20 shows a vertical cross-sectional view of a semiconductor device in a variation.

Moreover, in Embodiment 3, the upper portion of the dummy electrode 58 is covered with the interlayer insulating film 20. However, the upper portion of the dummy electrode 58 may be connected directly to the upper electrode 22. In this case, as shown in FIG. 20, a portion of polysilicon that configures the dummy electrode 58 can be provided on the upper surface 12a of the semiconductor substrate 12, and by that portion, the dummy electrode 58 can be connected to the upper electrode 22. Moreover, by providing an interlayer insulating film 21 between the polysilicon above the upper surface 12a and the first portion 35a in the pillar region 35, the first portion 35a can be prevented from being connected to the upper electrode 22.

Figure 21:
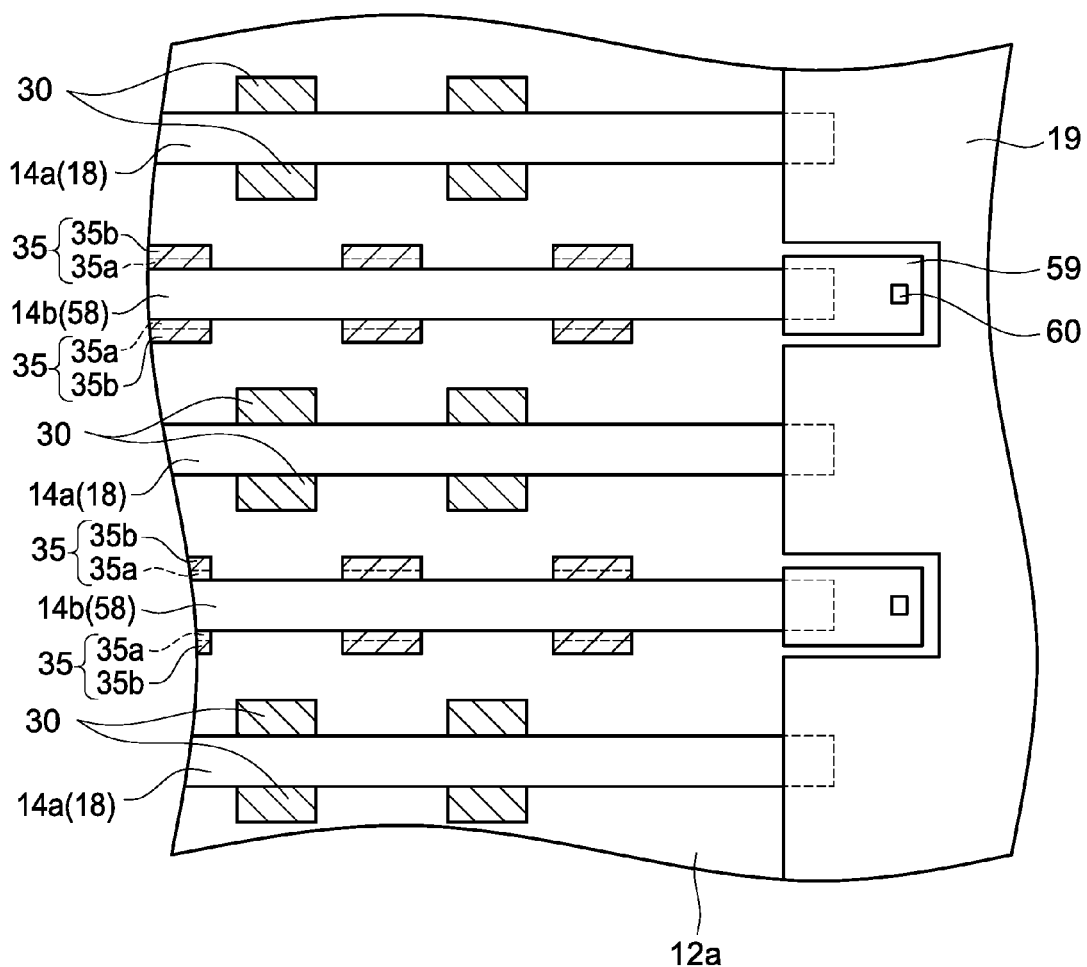
FIG. 21 shows a top view of a semiconductor device in a variation (Notably, only the elements necessary for description are shown.).

Moreover, as shown in FIG. 21, the pillar region 35 may partially be provided next to the dummy trench 14b. In this case, preferably, the emitter region 30 is partially provided next to the gate trench 14a, and the position of the second portion 35b is displaced from the position of the emitter region 30 in the longitudinal direction of each of the trenches. According to this configuration, a long distance can be ensured between the emitter region 30 and the second portion 35b, and the risk of latch-up in the IGBT can be reduced.

The art disclosed in the present specification will hereinafter be described. Notably, each of the technical elements described below independently has utility.

In a semiconductor device disclosed herein as an example, the pillar region may be in contact with the dummy insulating film. The spacing between the gate trench and the dummy trench can thereby be made further narrower.

In a semiconductor device disclosed herein as an example, the semiconductor substrate may further comprise an intermediate region of p-type located between the gate trench and the dummy trench and between the barrier region and the drift region and being in contact with the gate insulating film and the dummy insulating film. An average value of a density of p-type impurities in a portion of the intermediate region closer to the dummy trench than an intermediate position between the gate trench and the dummy trench is higher than an average value of a density of p-type impurities in a portion of the intermediate region closer to the gate trench than the center position. According to this configuration, a flow of a leakage current from the drift region toward the pillar region through the proximity of a lateral surface of the dummy trench can be suppressed.

The pillar region may comprise a first portion extending from the barrier region along a direction toward the front surface of the semiconductor substrate and a second portion extending from the first portion along a direction moving away from the dummy trench. The second portion may be connected to the front surface electrode. An end portion of the first portion on a front surface side may not be connected to the front surface electrode. According to this configuration, the path of a current that flows in the pillar region can be long. A leakage current that flows via the pillar region can thereby be suppressed.

The embodiments have been described in detail in the above. However, these are only examples and do not limit the claims. The technology described in the claims includes various modifications and changes of the concrete examples represented above. The technical elements explained in the present description or drawings exert technical utility independently or in combination of some of them, and the combination is not limited to one described in the claims as filed. Moreover, the technology exemplified in the present description or drawings achieves a plurality of objects at the same time, and has technical utility by achieving one of such objects.

The invention claimed is:

1. A semiconductor device comprising:
   a semiconductor substrate including a gate trench and a dummy trench which are provided in a front surface of the semiconductor substrate;
   a front surface electrode located on the front surface of the semiconductor substrate; and
   a rear surface electrode located on a rear surface of the semiconductor substrate,
   wherein
   a gate insulating film and a gate electrode insulated from the semiconductor substrate by the gate insulating film are located in the gate trench,
   a dummy insulating film and a dummy electrode insulated from the semiconductor substrate by the dummy insulating film and electrically separated from the gate electrode are located in the dummy trench,
   the semiconductor substrate comprises:
   an emitter region of n-type located between the gate trench and the dummy trench, being in contact with the gate insulating film, and exposed on the front surface of the semiconductor substrate;
   a body region of p-type located between the gate trench and the dummy trench and being in contact with the gate insulating film on a rear surface side of the emitter region;
   a barrier region of n-type located between the gate trench and the dummy trench and being in contact with the gate insulating film and the dummy insulating film at a rear surface side of the body region;
   a pillar region of n-type located between the gate trench and the dummy trench, connected to the front surface electrode, and connected to the barrier region;
   a drift region of n-type located on a rear surface side with respect to the barrier region, separated from the body region by the barrier region, and having a density of n-type impurities lower than a density of n-type impurities in the barrier region;
   a collector region of p-type exposed on the rear surface of the semiconductor substrate; and a cathode region of n-type exposed on the rear surface of the semiconductor substrate and having a density of n-type impurities higher than the density of n-type impurities in the drift region, and the pillar region is in contact with the dummy insulating film.

2. The semiconductor device of claim 1, wherein the semiconductor substrate includes a plurality of gate trenches and a plurality of dummy trenches which are arranged alternately and repeatedly in a cross-section orthogonal to the front surface of the semiconductor substrate.

3. A semiconductor device comprising:
a semiconductor substrate including a gate trench and a dummy trench which are provided in a front surface of the semiconductor substrate;
a front surface electrode located on the front surface of the semiconductor substrate; and
a rear surface electrode located on a rear surface of the semiconductor substrate,
wherein
a gate insulating film and a gate electrode insulated from the semiconductor substrate by the gate insulating film are located in the gate trench,
a dummy insulating film and a dummy electrode insulated from the semiconductor substrate by the dummy insulating film and electrically separated from the gate electrode are located in the dummy trench,
the semiconductor substrate comprises:
an emitter region of n-type located between the gate trench and the dummy trench, being in contact with the gate insulating film, and exposed on the front surface of the semiconductor substrate;
a body region of p-type located between the gate trench and the dummy trench and being in contact with the gate insulating film on a rear surface side of the emitter region;
a barrier region of n-type located between the gate trench and the dummy trench and being in contact with the gate insulating film and the dummy insulating film at a rear surface side of the body region;
a pillar region of n-type located between the gate trench and the dummy trench, connected to the front surface electrode, and connected to the barrier region;
a drift region of n-type located on a rear surface side with respect to the barrier region, separated from the body region by the barrier region, and having a density of n-type impurities lower than a density of n-type impurities in the barrier region;
a collector region of p-type exposed on the rear surface of the semiconductor substrate; and
a cathode region of n-type exposed on the rear surface of the semiconductor substrate and having a density of n-type impurities higher than the density of n-type impurities in the drift region,
the semiconductor substrate further comprises an intermediate region of p-type located between the gate trench and the dummy trench and between the barrier region and the drift region and being in contact with the gate insulating film and the dummy insulating film, and
an average value of a density of p-type impurities in a portion of the intermediate region closer to the dummy trench than a center position between the gate trench and the dummy trench is higher than an average value of a density of p-type impurities in a portion of the intermediate region closer to the gate trench than the center position.

4. The semiconductor device of claim 3, wherein the semiconductor substrate includes a plurality of gate trenches and a plurality of dummy trenches which are arranged alternately and repeatedly in a cross-section orthogonal to the front surface of the semiconductor substrate.

5. A semiconductor device comprising:
a semiconductor substrate including a gate trench and a dummy trench which are provided in a front surface of the semiconductor substrate;
a front surface electrode located on the front surface of the semiconductor substrate; and
a rear surface electrode located on a rear surface of the semiconductor substrate,
wherein
a gate insulating film and a gate electrode insulated from the semiconductor substrate by the gate insulating film are located in the gate trench,
a dummy insulating film and a dummy electrode insulated from the semiconductor substrate by the dummy insulating film and electrically separated from the gate electrode are located in the dummy trench,
the semiconductor substrate comprises:
an emitter region of n-type located between the gate trench and the dummy trench, being in contact with the gate insulating film, and exposed on the front surface of the semiconductor substrate;
a body region of p-type located between the gate trench and the dummy trench and being in contact with the gate insulating film on a rear surface side of the emitter region;
a barrier region of n-type located between the gate trench and the dummy trench and being in contact with the gate insulating film and the dummy insulating film at a rear surface side of the body region;
a pillar region of n-type located between the gate trench and the dummy trench, connected to the front surface electrode, and connected to the barrier region;
a drift region of n-type located on a rear surface side with respect to the barrier region, separated from the body region by the barrier region, and having a density of n-type impurities lower than a density of n-type impurities in the barrier region;
a collector region of p-type exposed on the rear surface of the semiconductor substrate; and
a cathode region of n-type exposed on the rear surface of the semiconductor substrate and having a density of n-type impurities higher than the density of n-type impurities in the drift region,
the pillar region comprises a first portion extending from the barrier region along a direction toward the front surface of the semiconductor substrate and a second portion extending from the first portion along a direction moving away from the dummy trench,
the second portion is connected to the front surface electrode, and
an end portion of the first portion on a front surface side is not connected to the front surface electrode.

6. The semiconductor device of claim 5, wherein the semiconductor substrate includes a plurality of gate trenches and a plurality of dummy trenches which are arranged alternately and repeatedly in a cross-section orthogonal to the front surface of the semiconductor substrate.

* * * * *